United States Patent [19]

Pissanetzky

[11] Patent Number: 5,798,679
[45] Date of Patent: Aug. 25, 1998

[54] MAGNETIC FLUX BENDING DEVICES

[75] Inventor: Sergio Pissanetzky, The Woodlands, Tex.

[73] Assignee: Houston Advanced Research Center, The Woodlands, Tex.

[21] Appl. No.: 484,057

[22] Filed: Jun. 7, 1995

[51] Int. Cl.$^6$ .................................................. H01F 5/00
[52] U.S. Cl. ............................................... 335/299
[58] Field of Search .......................... 335/216, 296–299;
336/211, 212, 214, 215, 216, 221; 365/1,
2, 13, 63, 66, 130, 230.01, 232

[56] References Cited

U.S. PATENT DOCUMENTS

| | | | |
|---|---|---|---|
| 3,622,869 | 11/1971 | Golay | 324/0.5 R |
| 4,682,111 | 7/1987 | Hughes | 324/320 |
| 4,791,370 | 12/1988 | MacKinnon | 324/318 |
| 4,965,521 | 10/1990 | Egloff | 324/312 |
| 5,130,686 | 7/1992 | Leupold | 335/216 |
| 5,237,277 | 8/1993 | Lenz | 324/322 |
| 5,243,286 | 9/1993 | Rzedzian et al. | 324/318 |
| 5,296,749 | 3/1994 | Berlincourt | 307/306 |
| 5,296,992 | 3/1994 | Abe | 360/126 |
| 5,315,276 | 5/1994 | Huson et al. | 335/216 |
| 5,359,310 | 10/1994 | Pissanetzky | 335/301 |
| 5,374,913 | 12/1994 | Pissanetzky et al. | 335/216 |
| 5,382,904 | 1/1995 | Pissanetzky | 324/319 |

FOREIGN PATENT DOCUMENTS 9303493  4/1993  WIPO ........................ H01F 5/00

OTHER PUBLICATIONS

The 3 Tesla Superferric Magnet Option For The Superconducting Supercollider; Bingham, H., et al.; Cryogenic Engineering Conference, Mass. Inst. of Tech.; Aug. 12–16, 1985.

Design of the Dipole Magnet for the "C" Version of the Superconducting Supercollider 20 TeV Twin–Beam Proton Accelerator (SSC); Pissanetzky, S., et al.; IEE Transactions on Nuclear Science, vol. NS–32, No. 5, Oct. 1985.

Structured Coils for NMR Applications; Pissanetzky, Sergio; IEEE Transactions on Magnetics, vol. 28, No. 4, Jul. 1992.

Minimum energy MRI gradient coils of general geometry; Pissanetzky, Sergio; Meas. Sci. Technol. 3 (1992) 667–673.

A Fast Switching Biplanar Gradient Coil with Cylindrical Shield; Pissanetzky, Sergio, et al.; Soc. Magnetic Resonance in Medicine; 11th Annual Scientific Mtg. Int'l Cong. Cent.; Aug. 8–14, 1992.

(List continued on next page.)

*Primary Examiner*—Michael L. Gellner
*Assistant Examiner*—Raymond Barrera
*Attorney, Agent, or Firm*—Winson & Elkins L.L.P.

[57] ABSTRACT

An apparatus and method for bending magnetic flux in a magnetic circuit are disclosed. A means for conducting a substantially planar electric current is placed in the path of the flux of a magnetic circuit. Current is then caused to flow in the conducting means, causing the magnetic flux in the magnetic circuit to deviate from its original path. A preferred embodiment of the invention is described wherein a series of coils are used to form both the planar conducting means and a partial flux conduit for coupling the flux bending apparatus to the magnetic circuit. Specific applications of the invention are disclosed in relation to magnets for use in magnetic resonance imaging applications, and magnets for use in dual dipole particle accelerator applications. Additional applications of the invention are described in relation to creating modular components for magnetic flux piping systems, such components including devices for splitting and recombining magnetic flux, concentrating and expanding magnetic flux, and switching magnetic flux to two or more different paths. Also disclosed are applications of the invention to create magnetic circuits wherein the flux pipes have a size on the order of microns. Specifically, a data storage device is disclosed containing micron-sized flux pipes and flux switching devices fabricated on a substrate and integrated with other circuitry.

11 Claims, 18 Drawing Sheets

OTHER PUBLICATIONS

Insertable biplanar gradient coils for magnetic resonance imaging; Martens, M.A., et al.; Rev. Sci. Instrum. 62 (11), Nov. 1991.

Gradient Coil Design Using Active Magnetic Screening; Bowtell, R., et al.; Magnetic Resonance in Medicine 17, 15–21 (1991).

Field Homogenizing Coils for Nuclear Spin Resonance Instrumentation; Golay, Marcel J.E.; The Review of Scientific Instruments; vol. 29, No. 4; Apr. 1958, 313–315.

Structured Coils and Nonlinear Iron; Pissanetzky, S.; 5th Biennial IEEE Conf. on Electromagnetic Field Computation; Aug. 3–5, 1992.

Magnetoelectronics; Prinz, Gary, et al.; Physics Today; Apr. 1995; pp. 24–25.

Magnetoelectronics Today and Tomorro; Simonds, John L.; Physics Today; Apr. 1995; pp. 26–32.

Micromagnetic Microscopy and Modeling; Dahlberg, E. Dan, et al.; Physics Today; Apr. 1995; pp. 34–40.

Complex Dynamics of Mesoscopic Magnets; Awschalom, David D. et al; Physics Today; Apr. 1995; pp. 43–48.

Spin–Polarized Transport; Prinz, Gary A.; Physics Today; Apr. 1995; pp. 58–63.

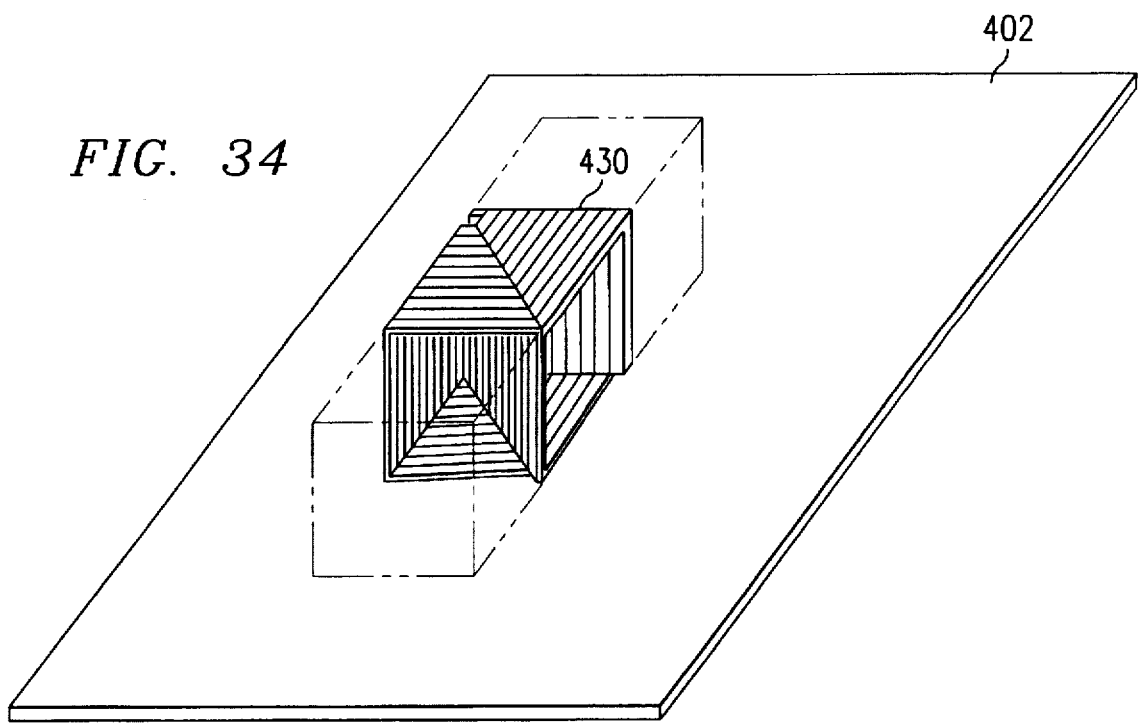
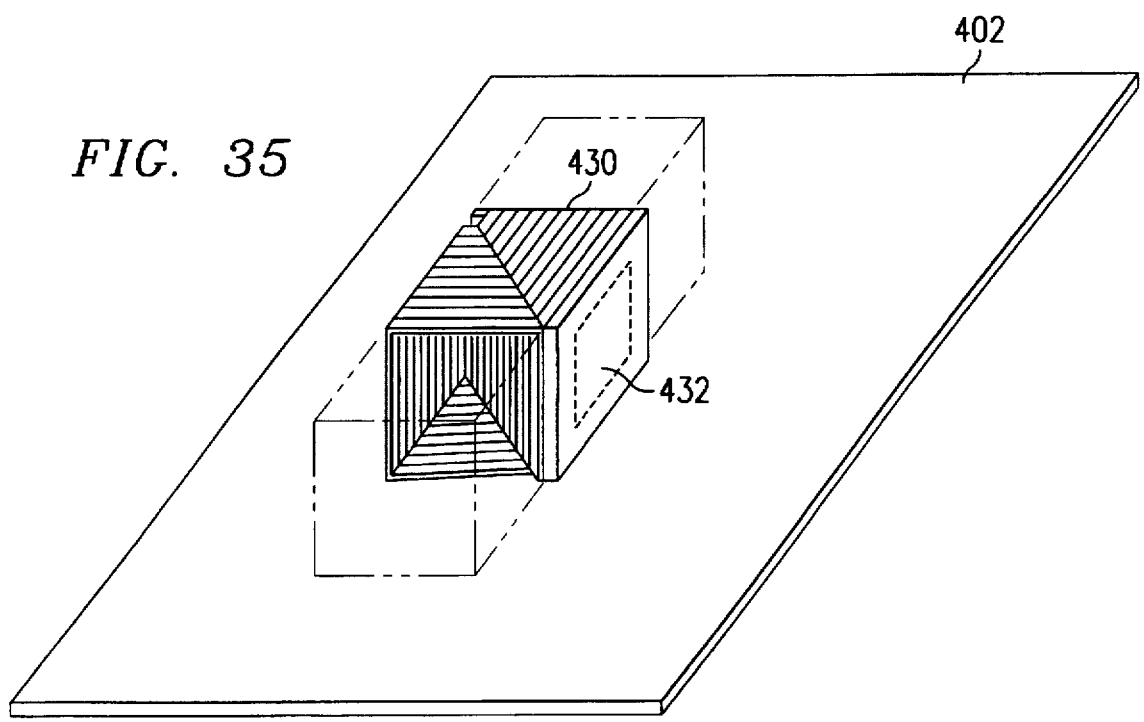

MAGNETIC FLUX BENDING DEVICES

FIELD OF THE INVENTION

This invention relates to apparatus and methods for bending or otherwise directing the path of magnetic flux in magnetic circuits such as, for example, those used in magnetic resonance imaging applications, particle accelerator applications, magnetic recording applications and magnetic energy storage applications.

BACKGROUND

In magnetic circuits, magnetic flux is created and caused to flow along a closed path in order to perform a certain function. For example, in a transformer, a closed path of magnetic flux is used to couple primary and secondary windings. In magnetic resonance imaging ("MRI") apparatus, a closed path of magnetic flux is used to provide a magnetic field in a volume of interest for the purpose of polarizing gyromagnetic atomic nuclei. In particle accelerators, magnetic flux is caused to flow along a closed path passing transversely through a particle beam in order to curve the trajectory of charged particles traveling in the beam. In still other applications, magnetic flux is caused to flow along a closed path whose direction or spatial orientation changes with time. For example, in magnetic recording, magnetic flux is caused to flow through a magnetically-alterable medium at different locations at different times in order to store information in the medium. In these applications as well as others, it would be highly desirable to bend the path of the magnetic flux in the circuit at arbitrary angles, including sharp angles, without disturbing the uniformity of the flux density distribution, and without causing flux "leaks" in which the flux deviates from the desired path of the circuit.

Designers have attempted to accomplish this result in a variety of ways. For low field strength applications, electromagnets and other magnetic circuits traditionally have been constructed using ferromagnetic legs in which the magnetic flux of the circuit is almost totally confined. This is because ferromagnetic core materials such as iron can greatly increase the strength of the magnetic field produced by a given electric current flowing in a given set of windings. Also, the core material in low field strength applications is able to contain virtually all of the magnetic flux produced by the windings, and to cause the flux to "flow" along a desired geometric path. A saturation effect, however, limits the ability of ferromagnetic core materials to perform these functions in high field strength applications. The consequences of the saturation effect are basically two-fold. First, it is necessary to rely on the brute force application of very large currents to generate magnetic fields greater than the saturation limit of the core material, which is about 2 Tesla in the case of iron. Second, the core material in high field strength applications ceases to provide an effective means for containing and directing the magnetic flux in the circuit.

In part because of these problems, iron core materials have been supplemented or replaced in some applications with "magnetic conductors" whose characteristics tend to confine magnetic flux. One well-known example of such a magnetic conductor is the long solenoid, shown in FIG. 1. The solenoid consists of many turns of coil wound to form a cylindrical structure. As is well known, the magnetostatic field associated with an infinitely long solenoid that has n turns per meter and that carries a direct current I is equal to nI in the axial direction inside the solenoid and is equal to zero outside the solenoid. Moreover, the field inside the solenoid is uniform. Therefore, the solenoid is able to confine magnetic flux without impairing its uniformity and is able to conduct it for long distances like an electric conductor conducts electric current. The solenoid is also easy to build because its windings are uniform and rectangular or circular in pattern. However, the solenoid cannot bend magnetic flux or return it along a closed path.

Another example of a well-known magnetic conductor is the toroid, shown in FIG. 2. A toroid is a structure like a ring with coils wound around it, essentially a solenoid bent to form a circle. A toroid can have a circular or rectangular cross section. As is the case with a solenoid, the magnetostatic field outside the toroid is equal to zero. Inside the toroid, the magnetostatic field at a particular radius $\rho$ is always in the azimuthal direction and is equal to $NI/2\pi\rho$, where N is the total number of windings on the toroid and I is the direct current carried in each winding. Thus, in the general case for toroids where the radius of the ring is not far greater than the radius of the coil windings in cross section, the magnetic flux density varies significantly with the radius. The flux density is highest at the inner radius, and lowest at the outer radius. Thus, while a toroid can bend magnetic flux and return it along a closed path, it is unable to preserve flux uniformity while doing so, especially when the flux must be bent at sharp angles. Yet another limitation of the toroid is that it is difficult to build because its windings are not uniform.

The shortcomings of these types of magnetic conductors can be seen especially well in MRI, particle accelerator and magnetic energy storage applications. In MRI applications, typical magnetic field strength requirements are on the order of 0.15 to 2.0 Tesla. New MRI applications such as spectroscopy and tomography may soon require magnetic field strengths in the range of 4.0 to 6.0 Tesla, well beyond the saturation point of iron. At the same time, the magnet used to produce the field in MRI applications must be reasonably compact and lightweight, the magnetic field produced must be highly uniform in the volume of interest, and the field outside of the magnet and volume of interest must be virtually nonexistent so as not to interfere with the operation of other electronic devices in the vicinity of the patient. Thus, MRI represents an important area in which a need exists for apparatus and methods to bend high-density magnetic flux around a relatively compact geometry, while containing the flux within the confines of the geometry and at the same time preserving flux uniformity. Because of the field strengths involved in MRI, iron cores alone are not capable of adequately performing all of these functions.

If toroidal components were used in MRI applications, they would necessitate the use of flux transformers, correction coils and the like near the volume of interest in order to redistribute the flux to make it as uniform as possible within the volume of interest.

By way of further background, U.S. Pat. No. 5,315,276, issued May 24, 1994, ("the '276 patent") discloses a modified toroidal structure for bending flux in an MRI magnet. The device of the '276 patent involves straight conductors internal to the toroidal structure and placed in an odd arrangement, resulting in even more fabrication complexity than a conventional toroid. Moreover, flux uniformity and efficiency of superconductor utilization are only partially achieved in the device of the '276 patent, because the magnetic field therein remains radially variable in the spaces between the layers of inner straight conductors and peaks at the radii defined by the straight conductors.

By way of further background, it is well known that essentially flat coils may be used in MRI applications to reduce field inhomogeneities in the volume of interest and to address eddy current problems and other anomalies. Such coils are generally placed adjacent to the pole faces of the magnet near the gap and volume of interest, and in a plane parallel to that of the pole faces. For example: Golay, "Field Homogenizing Coils for Nuclear Spin Resonance Instrumentation," *The Review of Scientific Instruments*, Vol. 29, No. 4 (April, 1958), pp. 313–15, teaches the use of coils assembled in flat stacks and placed on each pole piece of a nuclear spin resonance magnet; substantially planar gradient field structures adjacent the pole faces in a magnetic imaging apparatus are disclosed in U.S. Pat. No. 4,791,370, issued Dec. 13, 1988; the use of a plurality of essentially planar shim coils on the surface of the pole pieces of an NMRI magnet is disclosed in U.S. Pat. No. 4,682,111, issued Jul. 21, 1987; and planar homogenizing coils are also disclosed in U.S. Pat. No. 3,622,869, issued Nov. 23, 1971. In addition, Bowtell and Mansfield, "Gradient Coil Design Using Active Magnetic Screening," *Magnetic Resonance in Medicine*, Vol. 17 (1991), pp. 15–21, discloses the use of planar and biplanar gradient coils in NMR imaging; Martens, et al., "Insertable Biplanar Gradient Coils for Magnetic Resonance Imaging," *Rev. Sci. Instrum.* Vol. 62, No. 11 (November, 1991), pp. 2639–45, discloses the use of insertable planar gradient coils for higher gradient strength and shorter rise times; Pissanetzky and Elekes discuss a biplanar gradient system in their 1992 abstract, "A Fast Switching Biplanar Gradient Coil with Cylindrical Shield," *Society of Magnetic Resonance in Medicine*, 11th Annual Scientific Meeting, Berlin, Germany (Aug. 8–14, 1992); another biplanar gradient system is discussed in Pissanetzky, "Minimum Energy MRI Gradient Coils of General Geometry," *Meas. Sci. Technol.*, Vol. 3 (1992), pp. 667–73; and planar geometries in NMRI are also generally discussed in Pissanetzky, "Structured Coils for NMR Applications," *IEEE Transactions on Magnetics* Vol. 28, No. 4 (July, 1992).

By way of still further background, coils having a generally planar geometry have also been used for various purposes in magnets for particle acceleration, as is described, for example, in Pissanetzky and Schmidt, "Design of the Dipole Magnet for the 'C' Version of the Superconducting Supercollider 20 TeV Twin-Beam Proton Accelerator," *IEEE Transactions on Nuclear Science* Vol. NS-32, No. 5 (October, 1985), and in Bingham, et al., "The 3 Tesla Superferric Magnet Option for the Superconducting Supercollider," presented at the Cryogenic Engineering Conference at Massachusetts Institute of Technology, Cambridge, Mass. (Aug. 12–16, 1985).

In particle accelerator applications, very high magnetic field strengths are desirable for curving the trajectory of high-velocity charged particles in order to keep the particles within the circular confines of the accelerator. Even as early as the 1970s, accelerator magnets were being built to produce flux densities of approximately 1.3 Tesla for this purpose. Today, accelerator designs call for fields ten times as strong. Because of the size of the accelerator and the expense of the superconducting materials involved, such magnets must be compact in their geometry and efficient in their utilization of the current-carrying capacity of the superconducting coils. Additionally, such magnets generate strong and potentially self-destructive physical forces while operating. To preserve the magnet, these forces must be counterbalanced in a reasonably cost-effective manner. Thus, particle accelerators represent another important area in which a need exists for apparatus and methods to bend high-density magnetic flux around a relatively compact geometry. In addition, such apparatus and methods must work in a manner that efficiently utilizes the current-carrying capacity of the electromagnetic coils, and they must be useful in configurations that are easy to reinforce physically.

By way of further background, U.S. Pat. No. 5,374,913, issued Dec. 20, 1994, ("the '913 patent") discloses a twin-bore flux pipe dipole magnet for use in particle accelerators. In order to bend magnetic flux around a reasonably compact geometry, the magnet of the '913 patent uses a laminated iron core material having a "bubble" region wherein flux expands, and a "funnel" region wherein flux concentrates. The bubble and funnel regions of the '913 magnet are necessary to correct for nonuniformities introduced in the magnetic flux density distribution by a magnetic conductor in the device having the curved shape of a partial toroid.

In magnetic energy storage applications, present magnetic conductors have resulted in designs that are wasteful in terms of the grade of superconductor that must be used in relation to the total energy contained in the magnetic conductor. For example, in a toroid-shaped magnetic energy storage device, the critical current in the windings (and thus the grade of superconductor that must be used) depends on the peak field at the inner radius of the toroid. The field at all other radii in the toroid is less strong, however. Therefore, the toroidal shape is inherently inefficient in terms of energy storage because the field strength within it is not at a maximum at all radii. On the other hand, if a magnetic conductor were available in which flux could be confined and bent around a closed path without disturbing the uniformity of the flux density distribution, then such a conductor could be used to construct a magnetic energy storage device having greater efficiency than present devices because the field could be uniform at all radii within the device. Relative to a toroid-shaped device, more energy could be stored in such a new device using the same grade of superconducting material as is used in existing superconducting magnetic energy storage ("SMES") devices. Thus, magnetic energy storage represents another field in which a need exists for a device capable of bending magnetic flux at sharp angles in a magnetic circuit without disturbing the uniformity of the density distribution of the flux.

The failure of prior magnetic conductors to solve the above problems has impeded development in other areas as well, both in large-size and micro-size applications. For example, it would be desirable in many applications, such as in magnetic recording, to provide a closed path of magnetic flux whose size is on the order of microns, and whose direction or spatial orientation could be changed with time. Moreover, it would be desirable in many applications both large and small to provide a modular set of magnetic conductors enabling designers to create flux paths that are easily split, joined, concentrated, expanded and switched, and enabling designers to couple together magnetic conductors having different cross sectional areas and containing different flux densities without causing flux leaks. Prior magnetic conductors simply do not provide these capabilities. As a result, the potential new sciences of magnetic flux "piping" and of "micromagnetronics" have not developed in a meaningful way.

SUMMARY OF THE INVENTION

The invention is an apparatus and method for bending the path of magnetic flux in a magnetic circuit. In general, a flux bending device according to the invention may be implemented by placing a substantially planar electric conductor in the path of the magnetic flux of a magnetic circuit at the point in the circuit at which it is desirable to bend the magnetic flux. The planar conductor is oriented in relation to the magnetic circuit so that the magnetic field near the planar conductor has a non-zero component normal to the plane of the conductor, so that the flux in the circuit passes through the conductor. An electric current is then caused to flow in the conductor, causing the magnetic flux in the magnetic circuit to bend.

In one preferred embodiment, the flux bending device of the invention is fabricated using a series of superconducting coils, one set of coils having its axis parallel to one leg of the magnetic circuit and another set of coils having its axis parallel to a second leg of the magnetic circuit. It is also possible to fabricate the coils using non-superconducting materials. In either case, the outermost turns of each series of coils form partial flux conduits for joining the flux bending device to the legs of the magnetic circuit, while the innermost turns include linear portions forming a substantially planar conductor that extends from the inner corner of the bend to the outer corner of the bend. Coil current flowing through the linear portions provides the planar current necessary for bending the flux, and coil current flowing through the outermost portions contains the flux within the conduits on either side of the planar conductor.

One highly beneficial aspect of the flux bending device of the invention is that it may be constructed using one continuous winding, which is easy to realize in practice. Also, for applications in which superconducting wire is used to form the windings instead of regular conductor, continuous winding avoids the need for splicing the superconducting wire and thus avoids the expense associated with splicing as well as the well-known degradations in performance that can be caused by splicing.

Another highly beneficial aspect of the inventive apparatus and method is that magnetic flux may be bent at sharp angles without disturbing the uniformity of the density distribution of the flux, and without significant flux leakage. This functionality is highly desirable in numerous applications. In magnet design, it enables the use of compact geometries that are capable of providing highly uniform fields in the volumes of interest without the need for complicated and expensive corrective devices.

Yet another highly beneficial aspect of the inventive apparatus and method is that it enables the creation and use of a completely modular set of components for manipulating magnetic flux, thus providing designers with the ability to precisely control the presence or absence, intensity, shape and size of magnetic flux at all points in the circuit. In short, magnetic flux piping components built according to the invention enable magnetic flux to be controlled in a manner analogous to the control of water flow in a plumbing system using elbow fittings, T-fittings, pipes, adapters and the like. Therefore, although the invention is not limited to superconducting applications, the invention enables an entirely new technology of magnetic flux piping to be developed, especially as high-temperature superconducting materials become readily available.

For example, in one preferred embodiment, two planar conductors are formed at the end of one leg of a magnetic circuit. By applying a different electric current to both planar conductors, or by arranging the planar conductors at different angles, magnetic flux may be split in two different directions. The same device may be used in reverse in order to recombine flux paths previously split. Also, such a device is capable of joining flux pipes having different cross-sectional areas and containing different magnetic flux densities. In still another preferred embodiment, three or more flux pipes are joined with a planar conductor disposed between their respective ends and adapted to conduct different currents at different times. In this configuration, the planar conductor and flux pipes act as a switch for alternately diverting magnetic flux in two or more different directions. In still another preferred embodiment, one or more planar conductors are arranged at the end of a flux pipe in order to cause magnetic flux passing therethrough to be concentrated or, alternatively, expanded. In yet another embodiment, flux piping components such as those just described are miniaturized and combined on an integrated circuit substrate with other circuitry to implement useful micromagnetronic systems such as high-speed data storage devices requiring no moving magnetic media or recording heads.

In all of the various embodiments and applications of the invention, the angle of the planar conductor with respect to the incoming flux and the intensity of the current flowing in the conductor may be varied to yield a variety of flux bending angles and resultant magnetic field intensities.

BRIEF DESCRIPTION OF THE DRAWINGS

FIG. 34 is a perspective view illustrating a complete flux bending device formed on a microchip substrate.

FIG. 35 is a perspective view illustrating a complete flux bending device formed on a microchip substrate, with a magnetic storage medium formed adjacent to it.

DETAILED DESCRIPTION OF THE PREFERRED EMBODIMENTS

Principle of Operation

Figure 3:
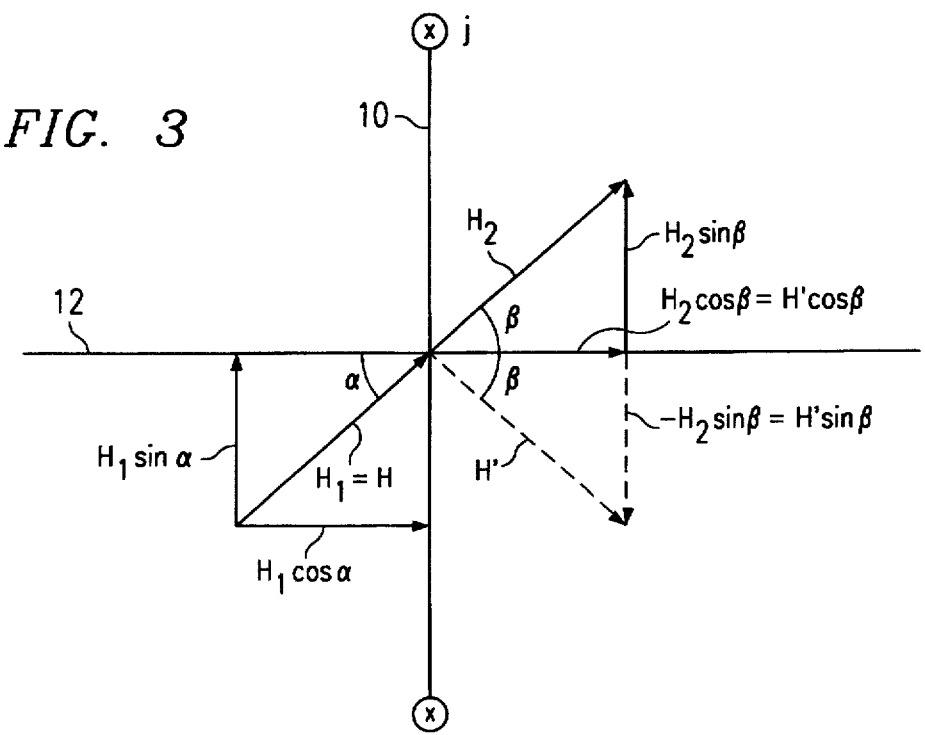
FIG. 3 is a diagram illustrating the behavior of a magnetic field in the presence of a current sheet.

The principle of operation of the invention will now be discussed with reference to FIGS. 3–5. FIG. 3 illustrates the behavior of a magnetic field in the presence of a substantially planar electric current having a magnitude j amperes per unit length and flowing in the direction indicated by the arrow tails within the circles (into the page). In the drawing, the substantially planar electric current is represented by current sheet 10. For purposes of illustration, assume that current sheet 10 is infinitely long and that the current j is uniform along the length of current sheet 10. Line 12 indicates the direction normal to current sheet 10. $H_1$ represents the magnetic field to the left of current sheet 10, while $H_2$ represents the magnetic field to the right of current sheet 10. $H_1$ is incident on current sheet 10 at an angle $\alpha$ from the normal, and $H_2$ exits current sheet 10 at an angle $\beta$ from the normal. Thus, $H_1\sin(\alpha)$ is the component of $H_1$ tangential to current sheet 10, while $H_1\cos(\alpha)$ is the component of $H_1$ normal to current sheet 10. By the same token, $H_2\sin(\beta)$ represents the component of $H_2$ tangential to current sheet 10, while $H_2\cos(\beta)$ represents the component of $H_2$ normal to current sheet 10.

Taking current sheet 10 to be a boundary surface, boundary conditions lead to the following two observations: First, the normal component of the magnetic flux density vector will be continuous across the boundary. Second, there will be a discontinuity in the tangential component of the magnetic field vector across the boundary, the discontinuity being equal to j. Thus, where the magnetic field is proportional to the magnetic flux density, boundary conditions dictate $$H_1\cos(\alpha)=H_2\cos(\beta) \qquad (1)$$

and $$H_1\sin(\alpha)-H_2\sin(\beta)=j \qquad (2)$$

In explaining the preferred embodiments of the invention, it will be helpful to designate simply as H the magnetic field entering current sheet 10, and to designate as H' the magnetic field exiting current sheet 10, where $H=H_1$, $H'\sin(\beta)=-H_2\sin(\beta)$ and $H'\cos(\beta)=H_2\cos(\beta)$. Equations (1) and (2) can then be rewritten $$H'\cos(\beta)=H\cos(\alpha) \qquad (3)$$

and $$-H'\sin(\beta)=H\sin(\alpha)-j \qquad (4)$$

Multiplying equation (4) by $1/[H'\cos(\beta)]$ yields $$\frac{-H'\sin(\beta)}{H'\cos(\beta)} = \frac{H\sin(\alpha)}{H'\cos(\beta)} - \frac{j}{H'\cos(\beta)} . \quad (5)$$

Using equation (3) and the identity $$\tan(A) \equiv \frac{\sin(A)}{\cos(A)} , \quad (6)$$

equation (5) may be rewritten $$-\tan(\beta) = \frac{H\sin(\alpha)}{H\cos(\alpha)} - \frac{j}{H\cos(\alpha)} . \quad (7)$$

Thus, $$-\tan(\beta) = \tan(\alpha) - \frac{j}{H\cos(\alpha)} . \quad (8)$$

Moreover, by the Pythagorean theorem, $$(H')^2 = [H'\cos(\beta)]^2 + [H'\sin(\beta)]^2 \quad (9)$$

Using equation (4), equation (9) may be rewritten $$(H')^2 = [H'\cos(\beta)]^2 + [-H\sin(\alpha)+j]^2 \quad (10)$$

Expanding the binomial, $$(H')^2 = [H'\cos(\beta)]^2 + [H\sin(\alpha)]^2 - 2Hj\sin(\alpha)+j^2 \quad (11)$$

But, also by the Pythagorean theorem, $$H^2 = [H\cos(\alpha)]^2 + [H\sin(\alpha)]^2 \quad (12)$$

and, using equation (3), $$H^2 = [H'\cos(\beta)]^2 + [H\sin(\alpha)]^2 \quad (13)$$

Thus, equation (11) becomes $$(H')^2 = H^2 - 2Hj\sin(\alpha)+j^2 \quad (14)$$

Solving equations (8) and (14) for $\beta$ and H' respectively yields $$\beta = \tan^{-1}\left[\frac{j}{H\cos(\alpha)} - \tan(\alpha)\right] \quad (15)$$

and $$H' = \sqrt{H^2 - 2Hj\sin(\alpha)+j^2} . \quad (16)$$

Therefore, given H, any combination of values for $\beta$ and H' may be obtained within a certain range by properly selecting $\alpha$ and j.

Figure 4:
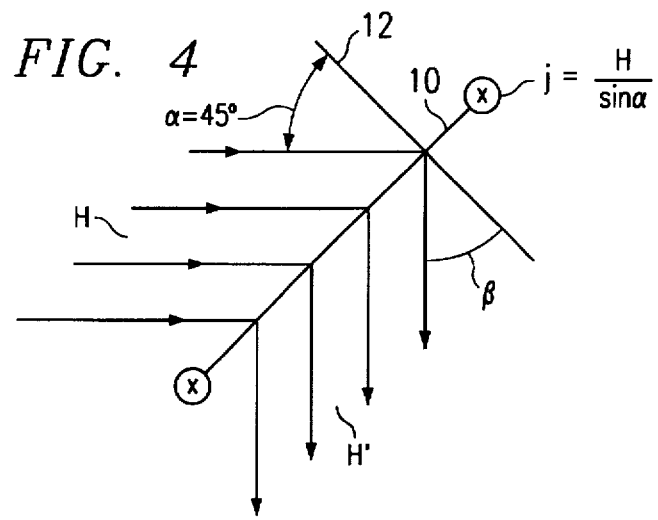
FIG. 4 is a diagram illustrating the behavior of a magnetic field in the presence of a current sheet wherein the angle of incidence of magnetic flux on the current sheet is equal to 45° from the normal and the magnitude of current per unit length flowing in the current sheet is equal to H/sin($\alpha$).
Figure 5:
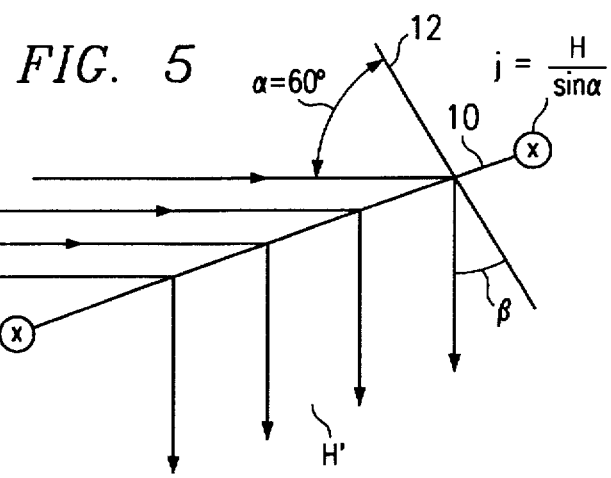
FIG. 5 is a diagram illustrating the behavior of a magnetic field in the presence of a current sheet wherein the angle of incidence of magnetic flux on the current sheet is equal to 60° from the normal and the magnitude of current per unit length flowing in the current sheet is equal to H/sin($\alpha$).

To illustrate the ramifications of this inventive principle, let us now consider the example cases of FIGS. 4 and 5. In FIG. 4, let $\alpha=45°$ and let $j=H/\sin(\alpha)$. Solving equations (15) and (16) for H' and H' yields $\beta=45°$ and H'=H. In other words, the magnetic flux passing through current sheet 10 under these conditions is bent by a total angle of 90°, and the magnetic field strength remains the same after the bend.

In FIG. 5, let $\alpha=60°$ and let $j=H/\sin(\alpha)$ again. Under these conditions, $\beta=30°$ and H' =(0.577)H. Thus, the magnetic flux passing through current sheet 10 is again bent by a total angle of 90°, but in this case the magnetic field strength is significantly weaker after the bend than before.

Basic Preferred Embodiments

Figure 1:
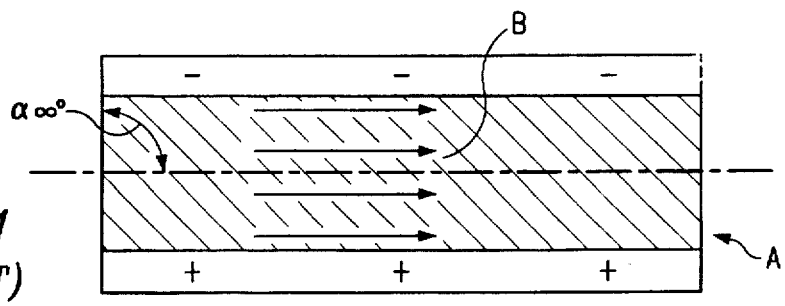
FIG. 1 (prior art) is a cross-sectional diagram of a solenoid.
Figure 2:
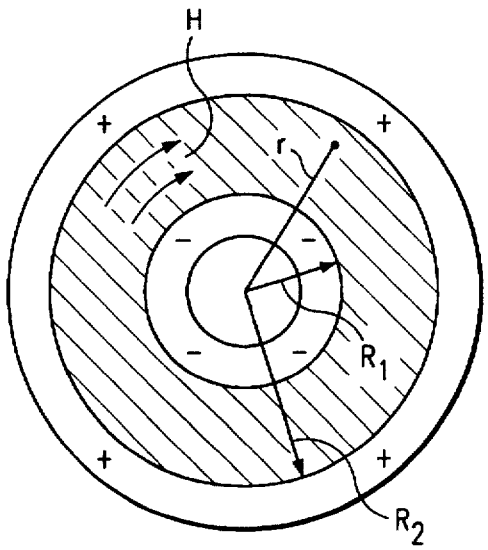
FIG. 2 (prior art) is a cross-sectional diagram of a toroid.
Figure 6:
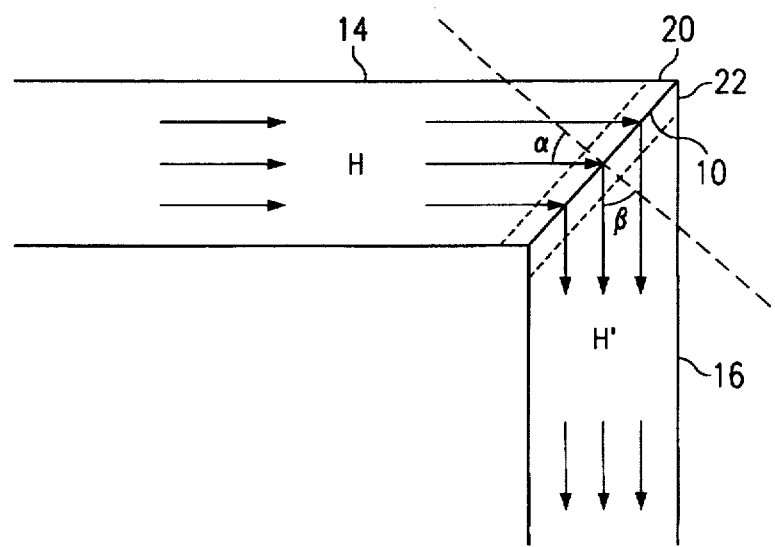
FIG. 6 is a schematic diagram illustrating a flux bending device according to a preferred embodiment of the invention.

Several exemplary embodiments of the invention will now be discussed with reference to FIGS. 6–10. FIG. 6 illustrates, in schematic form, an apparatus for bending magnetic flux 18 at an arbitrary angle without negatively affecting the uniformity of the distribution of the magnetic flux density. In the drawing of FIG. 6, components 14 and 16 represent solenoids analogous to that of FIG. 1. Alternatively, components 14 and 16 may be any means for substantially confining magnetic flux such as, for example, a core of ferromagnetic material such as iron. For brevity, the means for substantially confining magnetic flux 14 and 16 will be referred to hereinafter as "flux pipes" 14 and 16. Component 10 is a current sheet analogous to that of FIG. 3 carrying a substantially planar electric current into the page. Together, flux pipes 14 and 16 define first and second paths, respectively, for substantially confining magnetic flux. Flux pipe 14 has an end 20. Flux pipe 16 has an end 22. Flux pipe 14 contains magnetic field H near end 20. Flux pipe 16 contains magnetic field H' near end 22. Assuming that $\alpha$ in FIG. 6 is 45° and that current sheet 10 carries an electric current j into the page having a magnitude of $H/\sin(\alpha)$, then $\beta=45°$ and H'=H. Moreover, this result is accomplished without significantly disturbing the distribution of the magnetic field intensity along the cross sections of flux pipes 14 and 16. In other words, the field will be uniform in flux pipe 16 if it was uniform in flux pipe 14.

Figure 7:
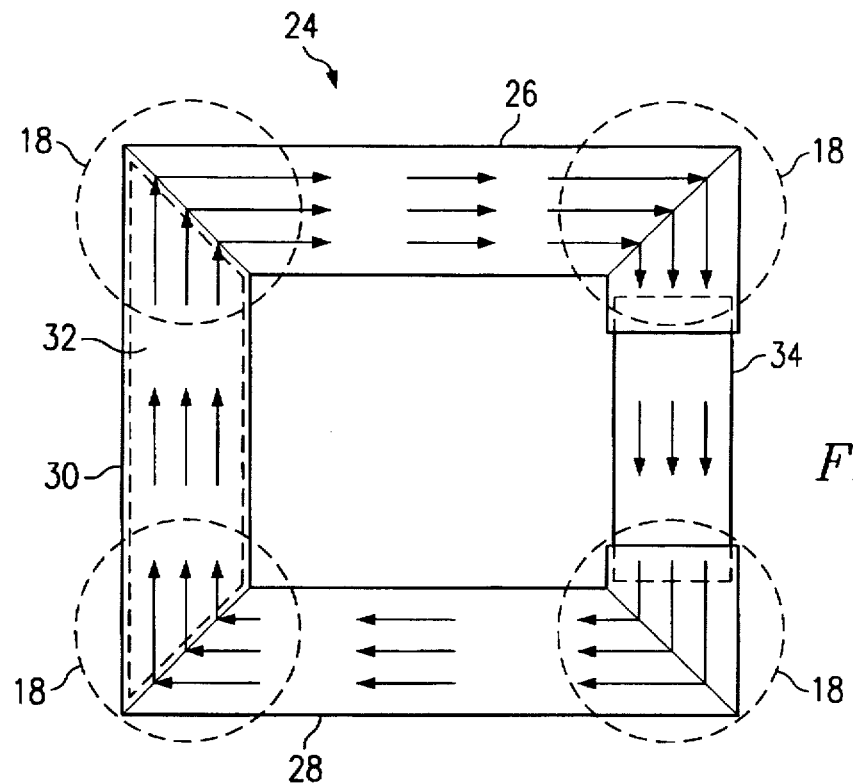
FIG. 7 is a schematic diagram illustrating a magnetic circuit that includes flux bending devices according to a preferred embodiment of the invention.

FIG. 7 illustrates the use of the flux bending device of FIG. 6 in a magnetic circuit 24 having a compact geometry and having sharp bends at each corner. In such a circuit, magnetic flux bending devices 18 are placed in every location at which it is desirable to bend magnetic flux sharply without negatively affecting its uniformity. As can be seen in FIG. 7, each leg of magnetic circuit 24 comprises a means for substantially confining magnetic flux. Various means may be used for this purpose. For example, in the drawing, legs 26 and 28 are solenoids with an air core, leg 30 is a solenoid with a core 32 of a ferromagnetic material such as iron, and leg 34 is simply a ferromagnetic core material with no solenoid around it. In practice, any combination of such legs may be used. For example all of the legs may be solenoids with air cores, or all of the legs may be solenoids with ferromagnetic cores.

Construction of Preferred Embodiments

Figure 8:
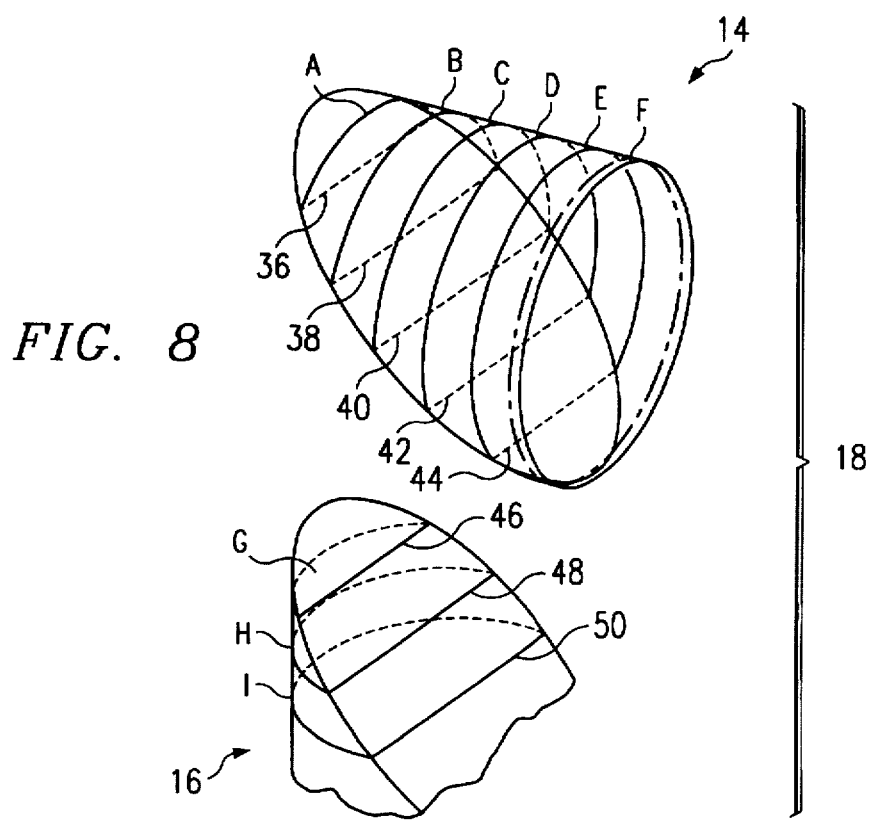
FIG. 8 is an exploded view illustrating the construction of a flux bending device having a circular or elliptical cross section.

Two basic types of preferred constructions for flux bending device 18 are shown in FIGS. 8 and 9. FIG. 8 shows an embodiment having a circular cross section, while FIG. 9 shows an embodiment having a rectangular cross section.

In the transparent view of FIG. 8, flux pipes 14 and 16 are partial solenoids formed with several turns of conducting coils. For illustration, the conducting coil of flux pipe 14 in the drawing comprises a plurality of turns A, B, C, D, E and F, while the conducting coil of flux pipe 16 comprises plurality of turns G, H and I. Each of the turns that make up the conducting coil for flux pipe 14 has a linear section 36–44 that passes through the volume contained within the conducting coil. Likewise, the turns that make up the conducting coil for flux pipe 16 each have a linear portion 46–50 that passes through the volume contained within the conducting coil. When flux pipes 14 and 16 are brought together, linear portions 36–50 approximate a plane of linear conductors passing through the volume contained by flux pipes 14 and 16. Thus, the linear portions 36–50 form a means for conducting a substantially planar electric current approximating a current sheet. While FIG. 8 is a partial view, it will be understood from the drawing that the coil of flux pipe 16 has approximately the same number of turns as flux pipe 14. Also, the number of turns of conductor shown in the drawing is intentionally small in order to make the illustration clear. It will be appreciated by those skilled in the art that many more turns would be used in an actual embodiment in order better to approximate a current sheet in the planar region and to confine flux in the solenoid region. Preferably, the conducting coils of flux pipes 14 and 16 are wound and connected so as to form one series electric circuit. In some applications, it may be preferable to wind flux pipes 14 and 16 as separate series electric circuits.

Figure 9A:
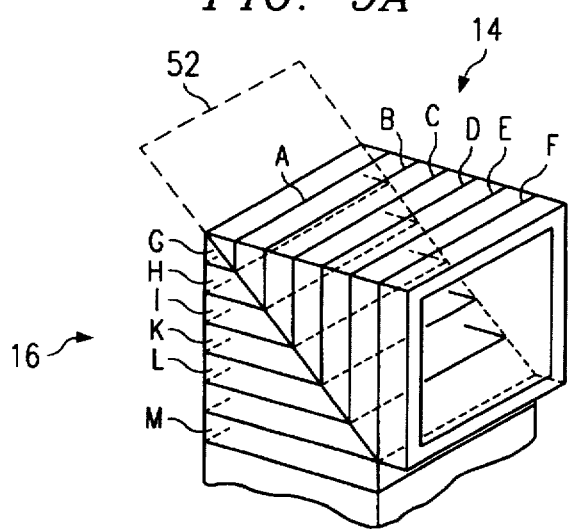
FIGS. 9A and 9B are perspective and exploded views, respectively, illustrating the construction of a flux bending device having a square or rectangular cross section.
Figure 9B:
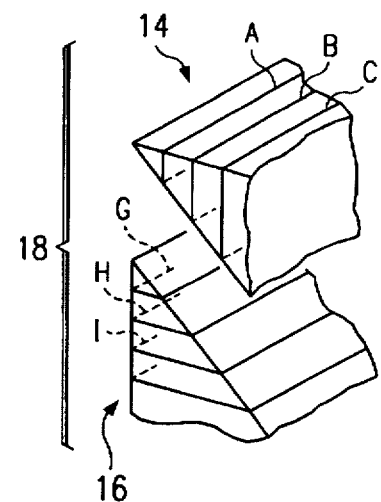

The embodiment shown in FIGS. 9A and 9B functions in the same manner as that of FIG. 8. Flux pipes 14 and 16 are shown in exploded view in FIG. 9B, whereas FIG. 9A illustrates the appearance of flux pipes 14 and 16 after they are joined, such that linear portions 36–50 form a plane 52.

In practice, it is convenient to construct flux bending device 18 by using a form around which the conducting coils may be wound, and against which the linear portions may be arranged. FIGS. 10–14 illustrate various embodiments of such forms. The forms of FIG. 10 and FIG. 14 have a rectangular cross-section and a stair-step pattern across the ends, although a form having a circular cross section may be used in applications such as that shown in FIG. 14.

Figure 10:
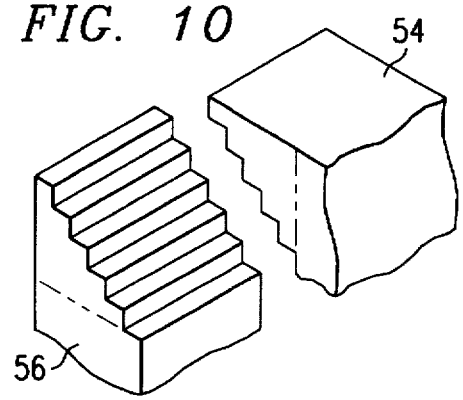
FIG. 10 is an exploded view of a form for constructing a flux bending device having a square or rectangular cross section.
Figure 11A:
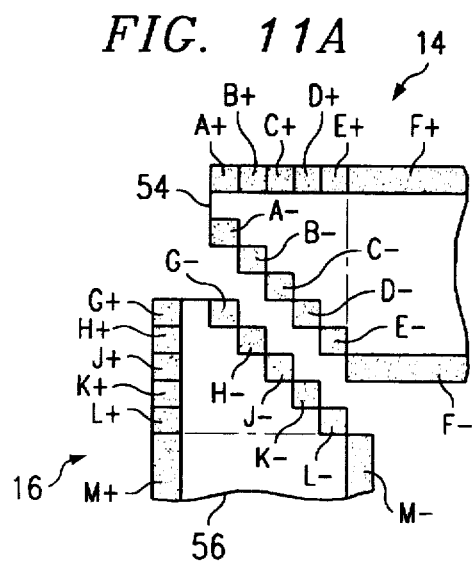
FIGS. 11A and 11B are exploded and cross-sectional views, respectively, illustrating a winding scheme for use with the form of FIG. 10.
Figure 11B:
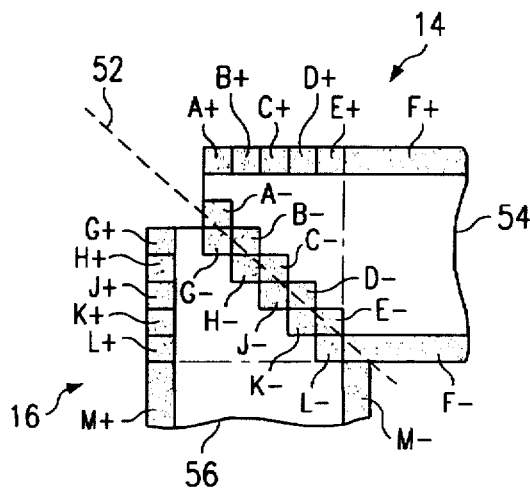

FIGS. 11A and 11B illustrate a winding scheme that may be used to construct the conducting coils using the form of FIG. 10. As shown in FIG. 11A, electrical conductors are wound around the outside of form 54 to create flux pipe 14. The designations F+ and F– indicate conductors carrying current out of and into the page, respectively, in the section of flux pipe 14 that forms a solenoid. Coil turns A, B, C and D in FIG. 11A form the end of flux pipe 14 and part of the current sheet. The designations + and – represent conductors carrying electric current out of and into the page, respectively. The same designations are used for coil turns B, C, D and E. As is shown in the drawing, each step in the stair-step pattern of form 54 may have numerous turns of electrical conductor wound around it. Flux pipe 16 is wound in like fashion around form 56, and the two sections are joined together as shown in FIG. 11B where coil sections A–, B–, C–, D–, E–, G–, H–, J–, K– and L– form a current sheet along plane 52. Forms 54 and 56 are preferably fashioned from a hollow metal material such as steel. It will be understood, however, that the forms could be made of other materials such as a solid ferromagnetic material like iron.

Figure 12:
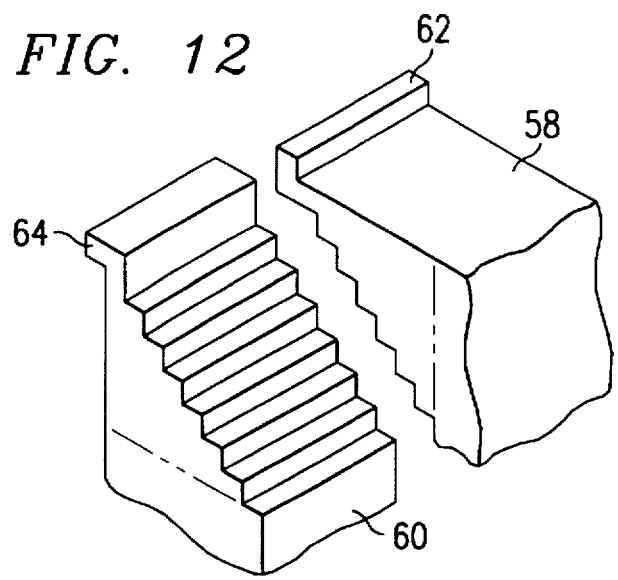
FIG. 12 is an exploded view of an alternative form for constructing a flux bending device having a square or rectangular cross section.
Figure 13:
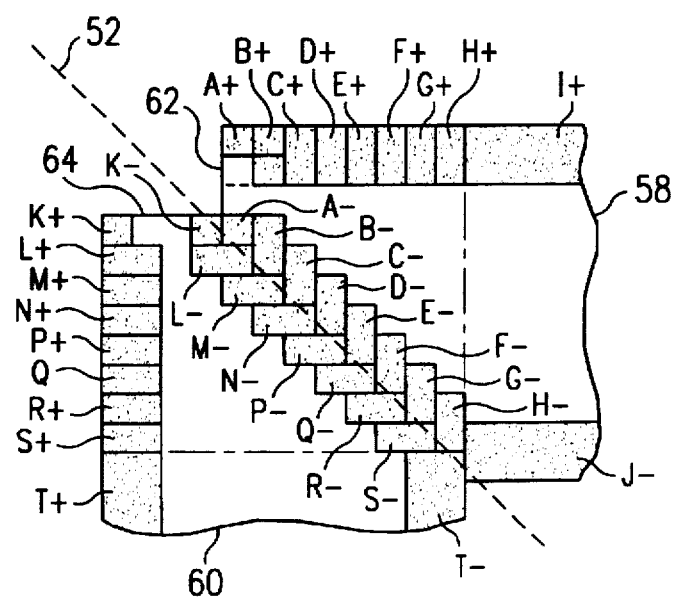
FIG. 13 is a cross-sectional view illustrating a winding scheme for use with the form of FIG. 12.

FIGS. 12 and 13 illustrate an alternative embodiment utilizing forms 58 and 60 and a different winding scheme. Forms 58 and 60 are of rectangular cross-section and have a stair-step pattern across their ends. They are similar to forms 54 and 56, with the addition of offset sections 62 and 64. As FIG. 13 illustrates, the cross-sections of winding portions B–H are rectangular rather than square, whereas the cross-sections of winding portions A and K are square at the tips of forms 58 and 60. It will be understood that numerous such alternative winding schemes may be implemented without deviating from the spirit and scope of the invention.

The conducting material used to create flux bending devices according to the invention may be regular conducting wire or superconducting material. For example, common copper wire insulated with enamel may be used, such as AWG 14 copper wire having a current carrying capacity of 20 amperes when air cooled in continuous operation and having a nominal diameter of 0.0675 inches when covered with heavy insulation of modified polyester rated at 200 degrees C. Six layers of such wire in a coil would result in a flux pipe having an 875 Gauss internal field.

In cases where superconducting wire is used, it is anticipated that a 6 Tesla flux pipe would require a linear electric current density on the order of 48,000 amperes per cm along the length of the pipe. Such a flux pipe could be wound, for example, with SCOK superconducting wire manufactured by Outokumpu Copper, Inc. of Glendale Heights, Ill., U.S.A. Such wire has an OD of 1.05 mm and is made of 2.32:1 Cu NbTi. It has a rating of 570 amperes at a 6 Tesla field when chilled at liquid Helium temperature, or about 4.3 degrees Kelvin.

It is believed that a 13 Tesla flux pipe, on the other hand, would require a linear current density on the order of 104,000 amperes per cm of length along the pipe. Such a pipe could be wound, for example, with a Copper-stabilized $Nb_3Sn$ multistrand superconducting cable having a width on the order of 6 mm and a thickness on the order of 1 to 1.5 mm, each turn being insulated by fiberglass cloth. Preferably, sections of such a flux pipe would be fabricated independently prior to reacting the $Nb_3Sn$ alloy in order to avoid possible post-reaction damage. Then, the sections would be connected in series and spliced as appropriate. $Nb_3Sn$ alloy will operate properly even at temperatures as high as 9.2 degrees Kelvin, which are easy to achieve with common well-known cryocoolers. Thus, liquid Helium supplies may be avoided.

High-temperature superconductors may also be used to wind flux pipes. Such materials require only inexpensive liquid nitrogen for cooling. By way of example, a flexible tape of high-temperature superconductor with a current carrying capacity of 1,000,000 amperes per $cm^2$ has recently been produced by the Superconductivity Technology Center of the Los Alamos National Laboratory.

Application of the Invention to Magnets for Use in MRI

Figure 14:
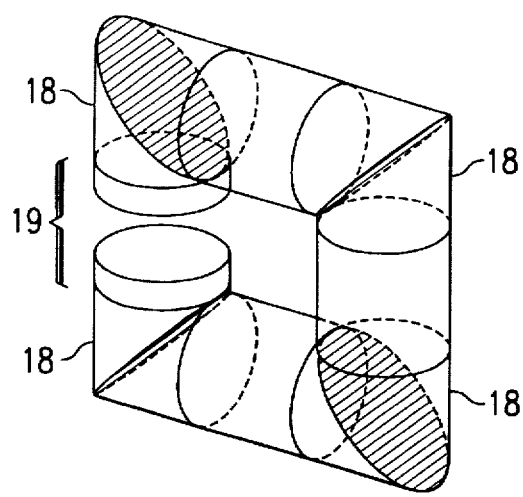
FIG. 14 is a perspective view of a magnet for use in MRI having a circular cross section and including flux bending devices according to a preferred embodiment of the invention.
Figure 15:
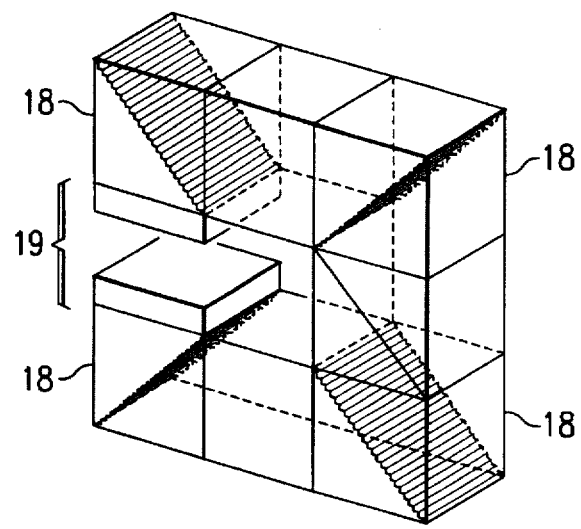
FIG. 15 is a perspective view of a magnet for use in MRI having a square cross section and including flux bending devices according to a preferred embodiment of the invention.

As discussed above, FIGS. 14 and 15 illustrate embodiments of a magnet for use in MRI and built using flux bending devices 18 according to the invention at each corner. FIG. 14 is a magnet with a circular or elliptical cross-section. FIG. 15 is a magnet with a square or rectangular cross-section. The flux bending devices 18 for the magnet of FIG. 15 may be constructed according to the winding schemes of either FIGS. 10 and 11 or FIGS. 12 and 13. The same is true for the flux bending devices 18 for the magnet of FIG. 14, except that the winding forms would have a circular cross section, as is generally indicated in FIG. 14. It is contemplated that such magnets would preferably have a field strength of 1.5 Tesla, with a 20 cm volume of interest, in which the magnetic field is highly homogeneous (e.g. better than 10 ppm). These magnets would be suitable for cardiac MRI and other whole-body or extremity imaging applications and would offer a completely open geometry, thus allowing unrestricted access to the patient during imaging. The magnet has a 60 cm gap, 60 cm pole faces and is generally C-shaped. It is also light, compact and easy to build owing to the use of flux bending devices at each corner. Although the magnet incorporates a pair of structured focusing coils 19 at the pole faces, the magnetic field is uniform in the entire flux pipe, thus eliminating the need for flux deflectors or complicated flux conditioning components.

Figure 16:
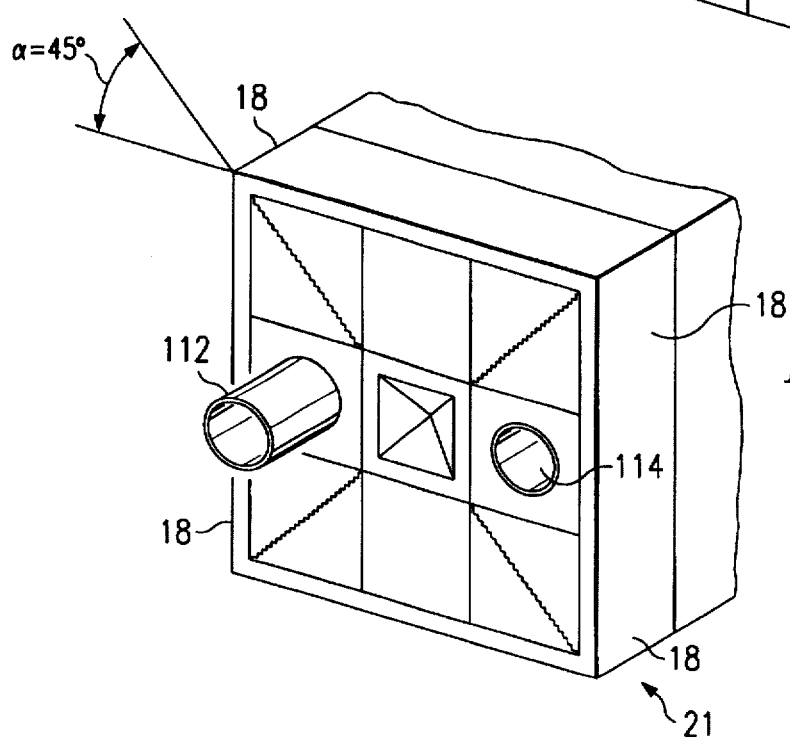
FIG. 16 is a perspective view of a dipole magnet for use in particle accelerators, the magnet having a square cross section and including flux bending devices according to a preferred embodiment of the invention.
Figure 17:
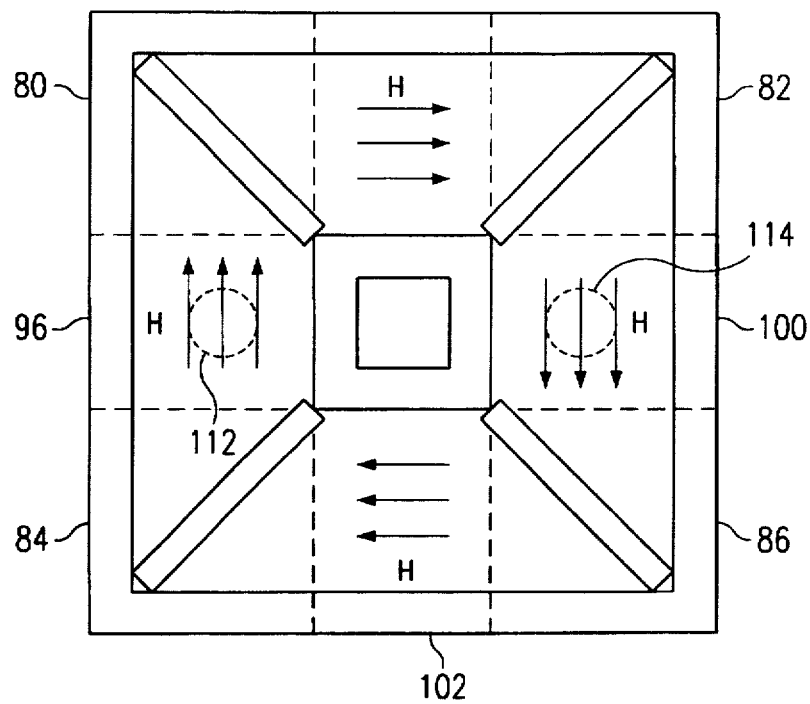
FIG. 17 is a cross-sectional schematic diagram illustrating a dipole magnet for use in particle acceleration and including flux bending devices according to the invention.
Figure 18:
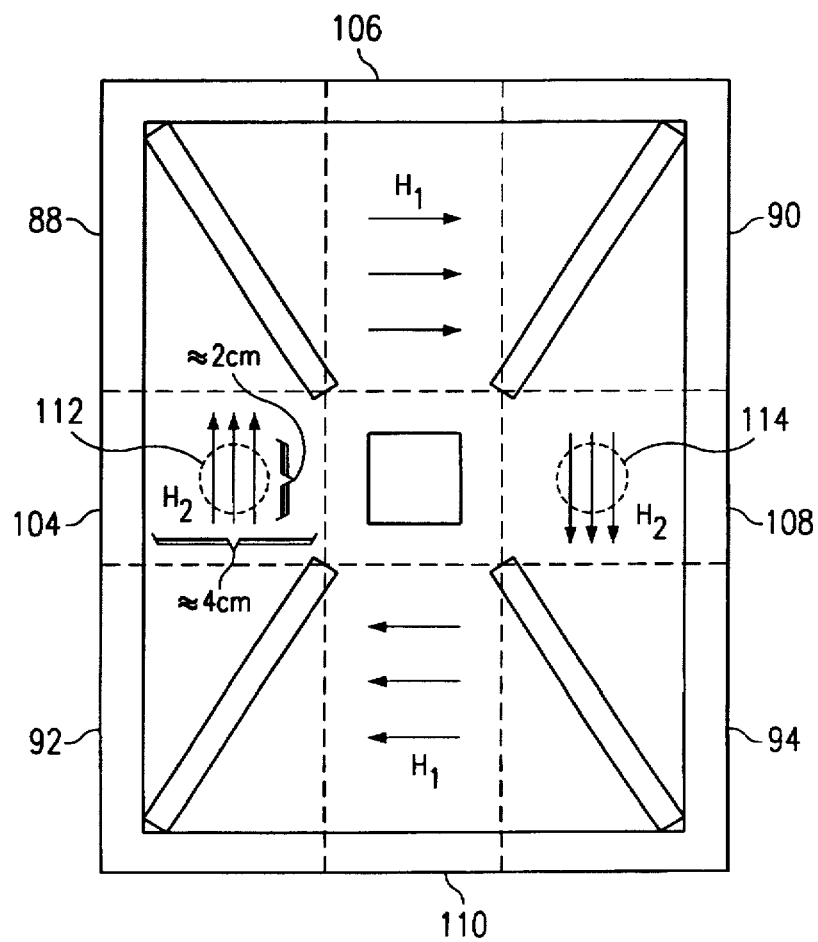
FIG. 18 is a cross-sectional schematic diagram illustrating an alternative dipole magnet for use in particle acceleration and including flux bending devices according to the invention.

Application of the Invention to a Dipole Magnet for Use in Particle Acceleration FIG. 16 is a perspective view of a magnet section 21 to be used in a particle accelerator, and illustrates how like magnet sections are pieced together end-to-end longitudinally along beam pipes 112 and 114 to form a long magnet. FIGS. 17 and 18 illustrate, in schematic cross-section, two particular embodiments of the magnet section of FIG. 16. Each of the embodiments shown in FIGS. 17 and 18 can be used to form a high-field dual dipole magnet suitable for use in particle accelerators. Each has four flux bends shown as elements 80–86 in FIG. 17 and as elements 88–94 in FIG. 18. Each also has four sections of standard dipole windings shown as elements 96–102 in FIG. 17 and elements 104–110 in FIG. 18. In a 13 Tesla version of the magnet, the standard dipole sections have an internal width of approximately 4 centimeters, while the two beam pipes 112 and 114 have a diameter of approximately 2 centimeters each. Both of the magnets shown in FIGS. 17 and 18 are very long in the direction perpendicular to the page, and are pieced together section-by-section to form the complete accelerator, as is shown generally in FIG. 16.

In the embodiment of FIG. 17, the corner sections are designed such that the flux density will be equal in each of the four sections 96–102. In the geometry of FIG. 18, however, corner sections 88–94 are designed such that the flux density in sections 106 and 110 will be substantially weaker than the flux density in sections 104 and 108. The methodology for designing the corner sections to achieve this result is described hereinabove in the section called "Principle of Operation." The advantage of designing the magnet according to the embodiment of FIG. 18 is that sections 106 and 110 may be constructed using less expensive superconductor material, such as NbTi. The only sections requiring more expensive superconducting materials are those confining higher flux densities H2 in the vicinity of beam pipes 112 and 114.

Figure 19:
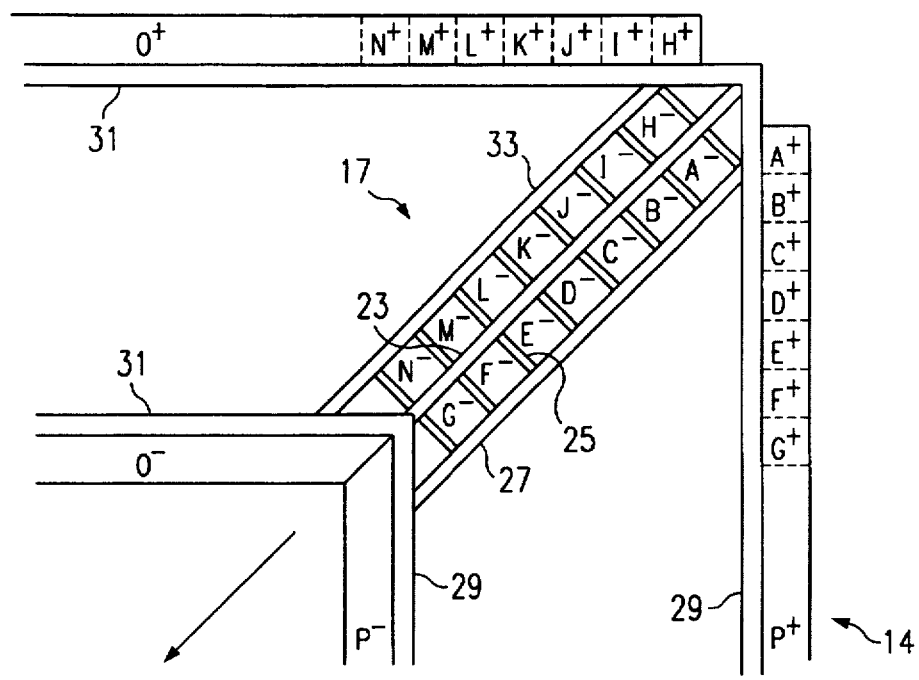
FIG. 19 is a cross-sectional diagram illustrating a preferred winding scheme and structure for use with the magnets of FIGS. 17 and 18.

FIG. 19 illustrates a preferred winding scheme for constructing the corners of the magnets of FIGS. 17 and 18. As in FIGS. 8, 9, 11 and 13, the designations + and – in FIG. 19 indicate coil turns for conducting current into and out of the page, respectively. Coil turns A through G form the end of solenoid section 14 and half of the current sheet. Coil turns P form the remainder of solenoid section 14. Coil turns H through N form the end of solenoid section 16 and the other half of the current sheet. Coil turns O form the remainder of solenoid section 16. A form 17 is provided at the corner, and comprises parallel rigid members 23, 27 and 33, all anchored to the forms 29 and 31 used to support the solenoid windings for solenoid sections 14 and 16. In addition, rigid cross members 25 are provided orthogonal to members 23, 27 and 33 and spaced at intervals along the length thereof, forming physically supported coil turn regions A– through N–. It is contemplated that members 23, 25, 27 and 33, as well as forms 29 and 31 would be fashioned from a metal such as stainless steel. It will be understood that numerous turns of conductor or superconductor may be wound through each of the physically supported coil turn regions, and that the actual number of such regions used may vary from that shown. Electrically, all coil turns may be connected as was described hereinabove in relation to FIGS. 8 through 13.

In operation, magnets of this type produce strong physical forces in the direction shown in FIG. 19 by the arrow. Such forces not only can destroy the magnet, but also can cause the superconducting coils to exert so much force on one another that quenching may result. One advantage of the winding and support configuration shown in FIG. 19 is that cross members 25 provide bearing surfaces to distribute such forces along the length of members 23, 17 and 33, thus reducing the overall force exerted by superconducting coil turns on one another, and thereby reducing the possibility of deformation and quenching.

Figure 20:
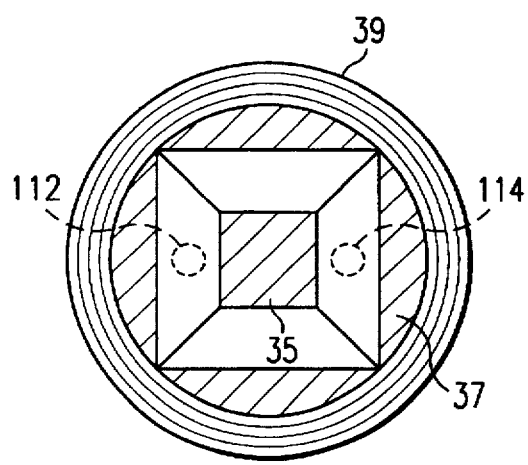
FIG. 20 is a cross-sectional diagram illustrating a preferred banding scheme for use with the magnets of FIGS. 17 and 18.

Another advantage of magnets of FIGS. 17 and 18, built according to the scheme of FIG. 19, is that they may be further physically reinforced as shown in FIG. 20. In FIG. 20, a metal filler material such as stainless steel would be placed in regions 35 and 37. Many layers of banding material such as stainless steel would be wound around the entire assembly, as shown at 39.

Application of the Invention to Superconducting
Magnetic Energy Storage Devices

Figure 21:
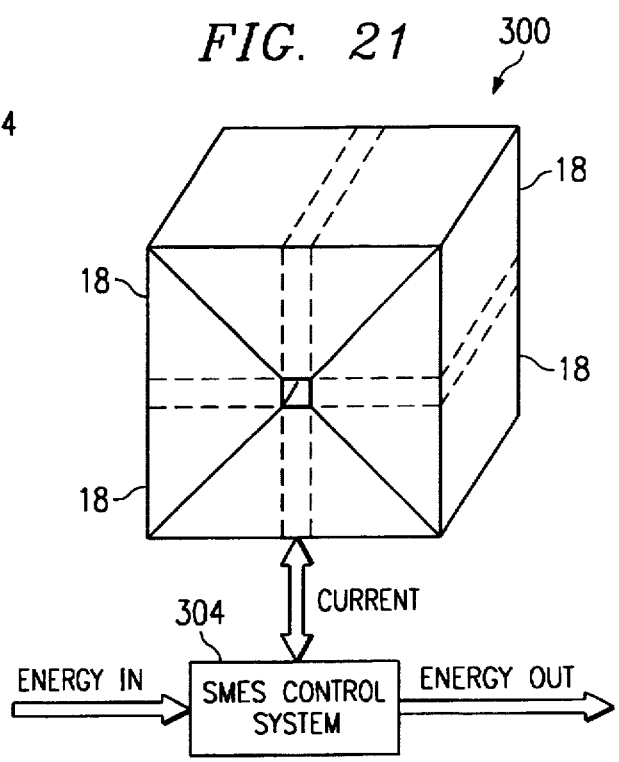
FIG. 21 is a schematic illustration of a superconducting magnetic energy storage device built with flux bending devices according to the invention.

FIG. 21 illustrates an application of the flux bending device of the invention to construct a compact superconducting magnetic energy storage (SMES) device of a kind suitable for use in "micro" SMES applications, where small size and flux confinement are desirable. As is shown, a SMES coil 302 is constructed using conventional techniques and materials, except that a magnetic flux bending device 18 is provided at each corner, resulting in an ultra-compact design. The flux bending devices 18 may be constructed using any of the techniques already described hereinabove. Conventional SMES control system 304 provides the necessary input, output and control circuitry to enable SMES coil 302 to store energy provided to the system for later delivery upon demand.

Because the flux bending devices of the invention may be used to bend the flux at sharp angles, a very compact design may be achieved, wasting no room in wide turns or flux-catching coils. Such a SMES device may also be used in close proximity to other equipment and personnel because the flux is entirely confined within the system.

Additionally, such a system yields cost savings in materials because it utilizes the current carrying capacity of superconducting materials more efficiently than present systems. The critical current of a superconducting coil immersed in its own field is determined by the highest value that the field attains at any point of the coil. As was discussed hereinabove, toroid-shaped magnetic conductors produce a field that is strongest at the inner radius of the coil and weaker at all other radii. Because the critical current for the superconductor used to wind such a coil is determined by the field at the inner radius, the current-carrying capacity of the superconductor is under-utilized at all other radii. Superconductor that withstands a high field is very expensive; thus, the resulting design is very wasteful. On the other hand, the flux bending device of the present invention may be used to build a magnetic energy storage device wherein the contained magnetic field has uniform strength even around bends in the magnetic energy storage device. In such a device, the current carrying capacity of the superconducting material used to wind the device is utilized as efficiently as possible. Relative to an optimized toroid of comparable size and operating under similar conditions of field strength and critical current, such a device can store 3.5 times more energy.

Application of the Invention to Create Modular
Components for Flux Piping Systems Several devices will now be described making use of the invention to create modular components that can be combined to perform a variety of functions with respect to magnetic flux. Those having ordinary skill in the art will appreciate that each of the devices to described may be constructed using the basic winding schemes already described hereinabove. For example, FIGS. 11A, 11B and 13 illustrate the use of "blocks" of linear portions coil turns used to form a substantially planar conductor. In general, the number of blocks carrying current into the paper and out of the paper are always the same. This is a fundamental principle stemming from magnetic flux conservation and confinement, as well as the conservation of electric current. Moreover, all of the devices with the exception of flux switches may be electrically configured as one continuous series electric circuit, although it may be preferable to use more than one circuit in the case of concentrators and expanders.

Figure 22:
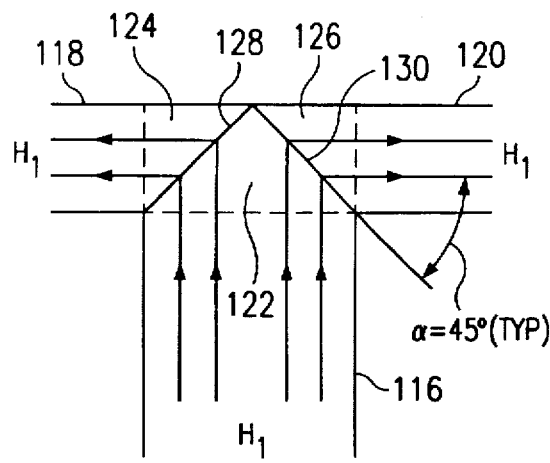
FIG. 22 is a cross-sectional schematic diagram illustrating a T-shaped flux splitting device according to the invention.
Figure 23:
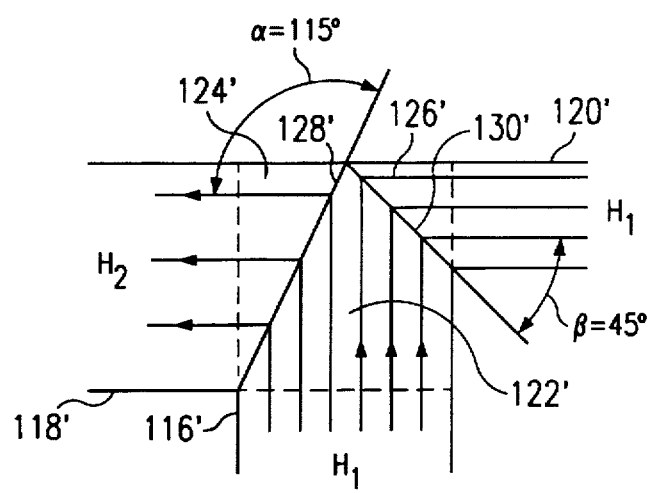
FIG. 23 is a cross-sectional schematic diagram illustrating an alternative T-shaped flux splitting device according to the invention.
Figure 24:
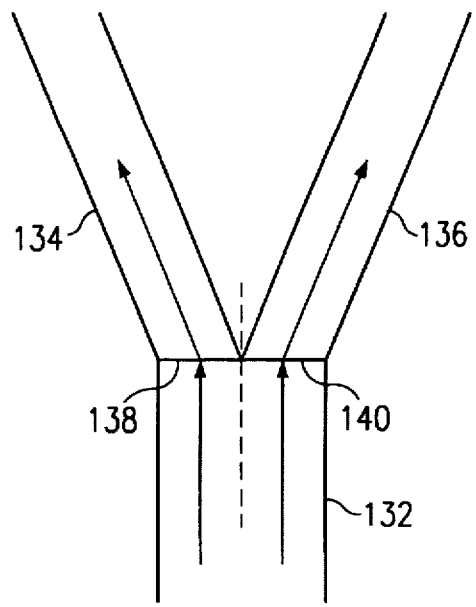
FIG. 24 is a cross-sectional schematic diagram illustrating a Y-shaped flux splitting device according to the invention.

FLUX SPLITTING DEVICES. FIGS. 22–24 illustrate how the flux bending device of the invention may be used to create flux splitting devices such as the T-shaped devices of FIGS. 22 and 23 and the Y-shaped device of FIG. 24. Specifically, FIG. 22 illustrates, in schematic form, an apparatus for dividing and directing magnetic flux from one path into two or more paths. In the embodiment of FIG. 22, the flux density in each path is equal. The apparatus is formed using three flux pipes 116, 118 and 120. For example, each of flux pipes 116, 118 and 120 may be a solenoid formed with conducting coils. Each flux pipe 116, 118 and 120 has an end 122, 124 and 126, respectively. Disposed between part of end 122 and end 124 is current sheet 128, or any suitable means for conducting a substantially planar electric current. It will be understood that ends 122 and 124 may be wound in a fashion similar as the embodiments discussed hereinabove. Thus, current sheet 128 may be implemented with a plurality of linear portions of the turns of the conducting coils. In like fashion, current sheet 130 for conducting a substantially planar electric current is disposed between part of end 122 and end 126.

FIG. 23 illustrates an apparatus for dividing and directing magnetic flux in which the magnetic flux is divided unequally. The device includes three flux pipes 116', 118' and 120' for substantially confining magnetic flux, each having an end 122', 124' and 126' respectively. Disposed between part of end 122' and end 124' is current sheet 128', or any means for conducting a substantially planar electric current. Disposed between the other part of end 122' and end 126' is current 130' for conducting a substantially planar electric current. Again, flux pipes 116', 118' and 120' may be formed using conducting coils having a plurality of turns, and current sheets 128' and 130' may be formed with linear portions of the turns of the conducting coils. In the geometry of FIG. 23, current sheets 128' and 130' are disposed at different angles with respect to the axis of flux pipe 116'. Also, the cross-sectional area of flux pipe 120' is different from that of flux pipe 116' and 118'. The result is that the flux density confined within flux pipe 120' is equal to the flux density confined within flux pipe 116'. The flux density confined within flux pipe 118', however, is substantially less than that confined in either flux pipe 116' or flux pipe 120'.

FIG. 24 illustrates another embodiment of an apparatus for dividing and directing magnetic flux from one path into two or more paths. In the embodiment of FIG. 24, the flux is diverted at angles less than 90°. Three flux pipes 132, 134 and 136 are provided for substantially confining magnetic flux along first, second and third paths respectively. Two current sheets 138 and 140 are provided for conducting substantially planar electric currents. In the embodiment of FIG. 24, current sheet 138 and current sheet 140 conduct currents in opposite directions from one another. The result is that the flux in flux pipe 132 is diverted in two different directions corresponding to the axes of flux pipes 134 and 136 respectively.

Figure 25:
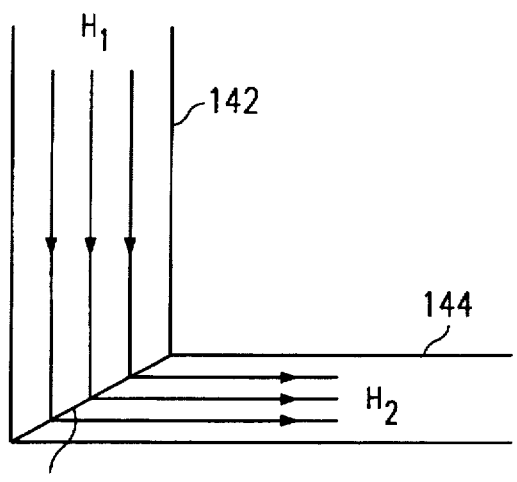
FIG. 25 is a cross-sectional schematic diagram illustrating a right-angle flux concentrator according to the invention.
Figure 26:
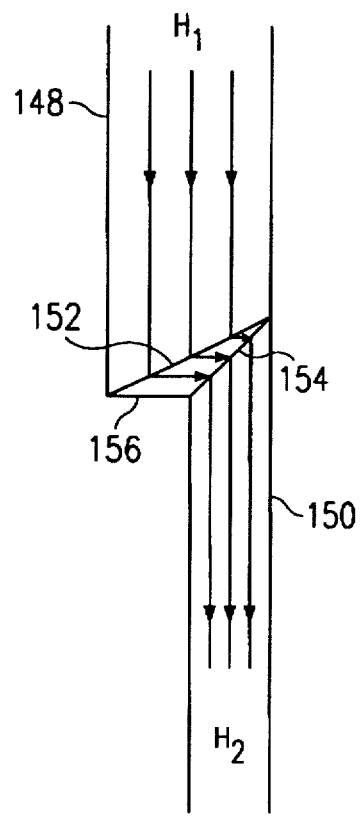
FIG. 26 is a cross-sectional schematic diagram illustrating an asymmetrical in-line flux concentrator according to the invention.
Figure 27:
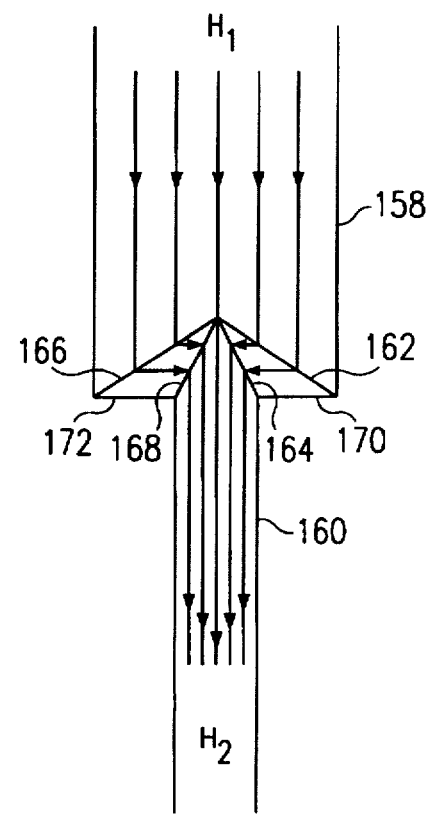
FIG. 27 is a cross-sectional schematic diagram illustrating a symmetrical in-line flux concentrator according to the invention.

FLUX CONCENTRATORS. FIGS. 25–27 illustrate basic devices for concentrating or expanding magnetic flux. In the device of FIG. 25, first and second flux pipes 142 and 144 are provided for substantially confining magnetic flux along two axes. Current sheet 146 is provided between the ends of flux pipes 142 and 144 for conducting a substantially planar electric current therebetween. In the configuration shown, the cross-sectional area of flux pipe 142 is greater than the cross-sectional area of flux pipe 144. Thus, flux density $H_2$ is increased relative to flux density $H_1$. The flux is also diverted into a flux pipe having an axis at 90° relative to the axis of flux pipe 142.

In FIG. 26, a flux concentrator is illustrated wherein flux from a flux pipe 148 is concentrated and redirected into a flux pipe 150 having a cross-sectional area smaller than that of flux pipe 148 and having an axis parallel to but different from that of flux pipe 148. To accomplish this, two current sheets 152 and 154 are provided. Current sheet 152 is disposed at the end of flux pipe 148. Current sheet 154 is disposed at the end of flux pipe 150. Between current sheets 152 and 154 is a partial flux pipe 156.

The device of FIG. 27 concentrates magnetic flux and directs it from flux pipe 158 into flux pipe 160. Flux pipe 160 has a smaller cross-sectional area than flux pipe 158. The axis, however, of flux pipe 160 is the same as that of flux pipe 158. Thus, the flux concentrator of FIG. 27 is symmetrical. To accomplish this result, current sheets 162, 164, 166 and 168 are provided. Current sheet 162 is disposed across part of one end of flux pipe 158. Current sheet 166 is disposed across the other part of the same end of flux pipe 158. Current sheets 164 and 166 are likewise disposed across two parts of the end of flux pipe 160. Current sheets 166 and 168 are coupled via partial flux pipe 172. Current sheets 162 and 164 are coupled via partial flux pipe 170.

In all of the embodiments shown in FIGS. 25–27, the general relationship between cross-sectional area and flux density is given by $B2=(A1/A2)B1$, where A1/A2 is the coefficient of concentration. Thus, it will be appreciated by those skilled in that art that other types of flux concentrators may be implemented using these basic configurations and relationships. For example, by reversing the flow of flux through the concentrator, the flux may be expanded by the same proportions.

Figure 28:
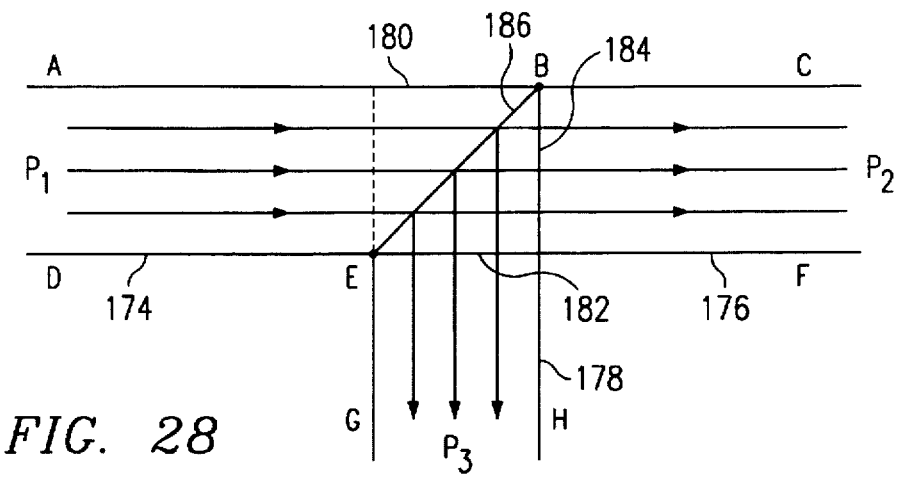
FIG. 28 is a cross-sectional schematic diagram illustrating a flux switching device according to the invention.
Figure 29:
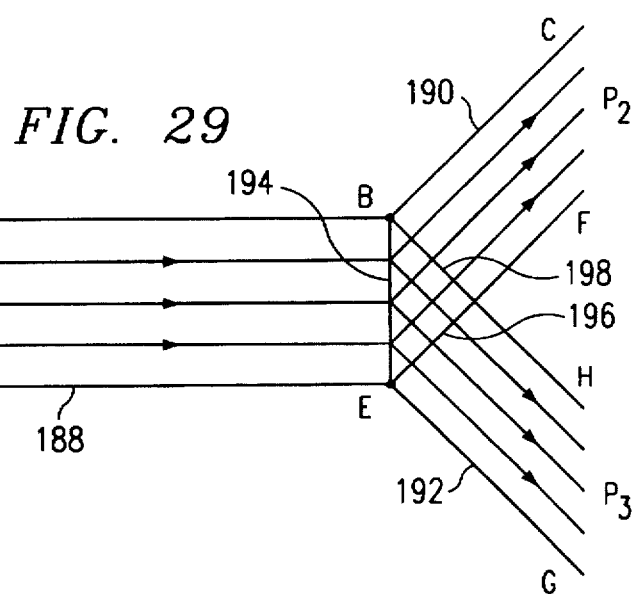
FIG. 29 is a cross-sectional schematic diagram illustrating an alternative flux switching device according to the invention.

FLUX SWITCHES. FIGS. 28 and 29 illustrate two embodiments of a switch for alternately diverting magnetic flux in two or more different directions. In the embodiment of FIG. 28, first, second and third flux pipes 174, 176 and 178 are provided along first, second and third paths respectively. In the embodiment of FIG. 28, the path of flux pipe 174 coincides with the path of flux pipe 176, while the path of flux pipe 178 represents an alternate path. Flux pipes 174, 176 and 178 have ends 180, 182 and 184 respectively. As can be seen, the ends 182 and 184 of flux pipes 176 and 178 are substantially coterminous at E–B. A current sheet 186 is provided for conducting at least two possible substantially planar electric currents at different times. In a preferred embodiment, flux pipes 174, 176 and 178 are constructed using conducting coils, and coil sections EB, BC, EF, EG and BH are capable of being separately energized. Sections AB and DE are always energized. Thus, to direct flux from P1 to P2, sections BC and EF are energized while sections EB, EG and BH are not energized. To redirect flux from P1 to P3, sections EB, EG and BH are energized while sections BC and EF are not energized.

FIG. 29 illustrates, in schematic form, another embodiment of a switch for alternately diverting magnetic flux in two or more different directions. In the embodiment of FIG. 29, flux pipes 188, 190 and 192 are provided for substantially confining magnetic flux along paths P1, P2 and P3 respectively. Ends 196 and 198 of flux pipes 190 and 192, respectively, are substantially coterminous at B–E. Current sheet 194 is provided across B–E for conducting at least two different substantially planar electric currents at different times. Again. flux pipes 188, 190 and 192 may be constructed with conducting coils having a plurality of turns. Sections AB and DE are always energized. To direct flux from path P1 to path P2, section BE is energized to conduct a first substantially planar electric current while sections BC and EF are energized and sections BH and EG are not energized. To redirect flux from path P1 to P3, section BE is energized to conduct a second substantially planar electric current (for example, a current of the same magnitude but in the opposite direction) while sections BH and EG are energized and sections BC and EF are not energized.

In the embodiments of FIGS. 28 and 29, it is preferable to use flux pipes having a rectangular cross section, although other geometries such as circular cross sections are possible. Any conventional driving and switching circuitry may be used to energize the proper coil sections at the proper times, and to cause the current sheets to conduct planar currents in different directions at different times.

Figure 30:
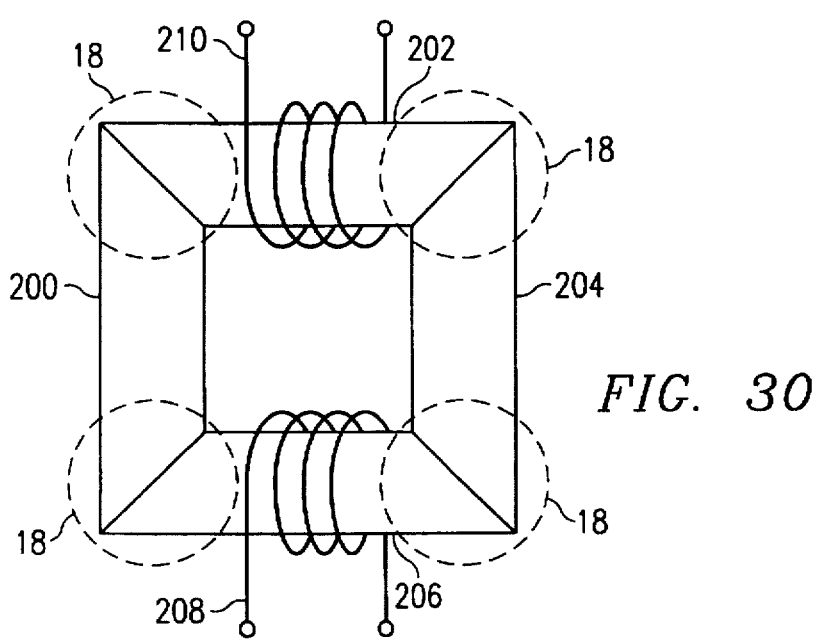
FIG. 30 is a schematic diagram of a transformer formed with flux pipes and flux bending devices according to the invention.

FLUX PIPE TRANSFORMERS, MOTORS AND ACTUATORS. Magnetic flux pipes can be used to replace ferromagnetic cores in practically every application in which such cores are used. For example, FIG. 30 illustrates a transformer constructed using a closed magnetic circuit made with flux pipes 200–206 having magnetic flux bending devices 18 formed at each corner. The flux pipes can be wound, for example, with superconducting wire, including high-temperature superconductor. The primary and secondary coils 208 and 210 may be wound directly on top of the flux pipes. As in the case of a traditional transformer, power is transmitted between the primary and secondary coils. However, in the transformer of the invention, there are no eddy current losses or hysteresis losses, and coupling between the primary and secondary coils is nearly full. Those having skill in the art will appreciate that this concept applies equally to other devices such as motors and actuators.

Application of the Invention to Create Micromagnetronic Circuits

Figure 31:
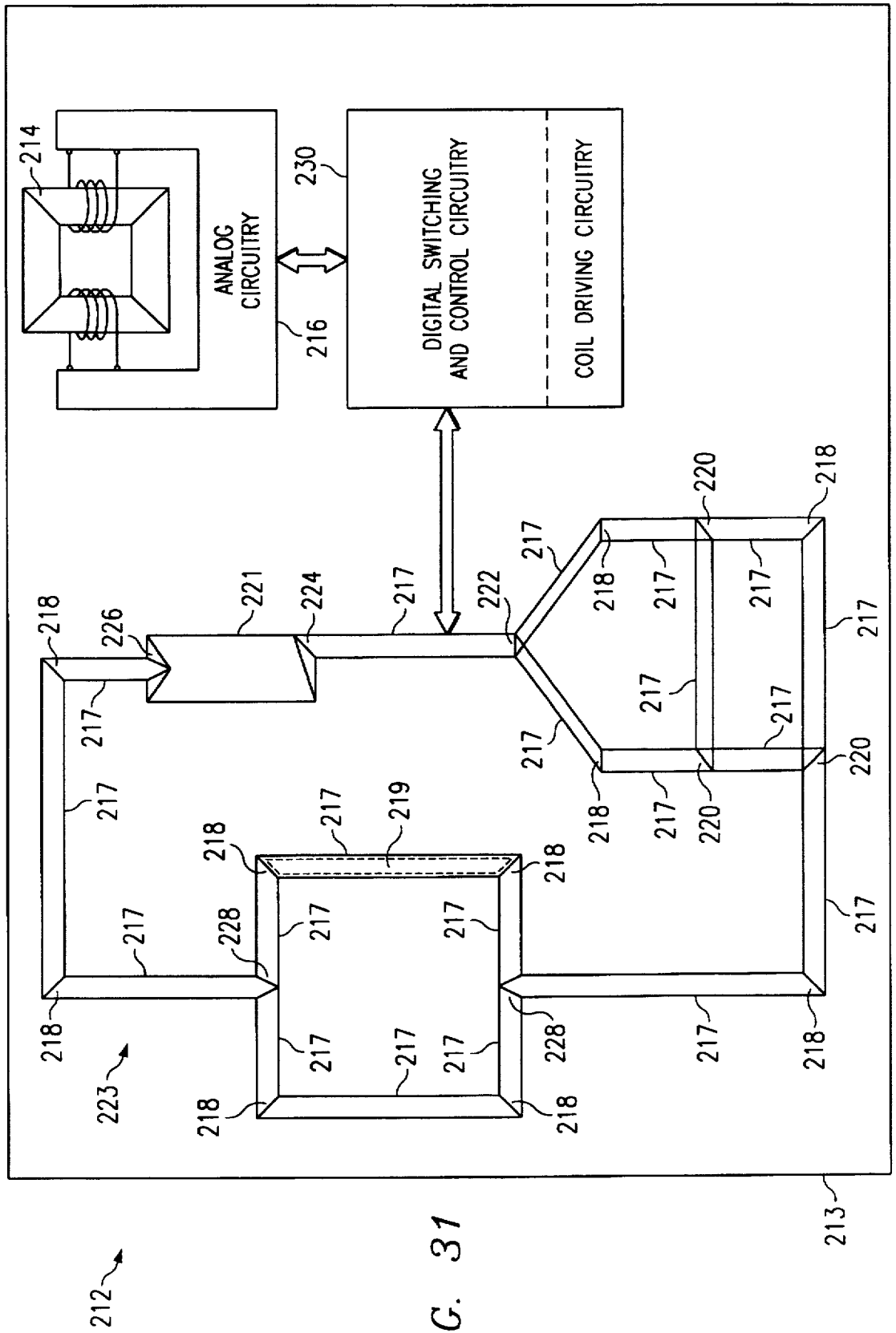
FIG. 31 is a schematic diagram of an integrated circuit according to the invention including micromagnetronic circuitry as well as conventional analog and digital circuitry all formed on a single substrate and small enough to fit within a microchip package.

GENERAL ADVANTAGES. FIG. 31 schematically illustrates an integrated circuit 212 formed on a substrate 213. The circuit combines, in one miniature package, magnetic flux pipes and flux bending devices having a size on the order of microns ("micromagnetronic circuits") with analog circuitry and digital circuitry. Although the specific configuration of the circuits in FIG. 31 is for illustration only, the figure illustrates how elements such as those discussed hereinabove may be combined in a single integrated circuit package to provide highly useful results. For example, a transformer according to FIG. 30 may be implemented on substrate 213 to yield a miniature transformer 214 coupled with miniature analog circuitry 216. Likewise, magnetic circuitry 223 may be formed on substrate 213. Magnetic circuitry 223 may contain any one or a combination of any of the devices discussed hereinabove, including variations thereof. Magnetic circuitry 223 may comprise flux pipes 217, which may also have ferromagnetic coil material 219 placed therein. Magnetic circuitry 223 may also include flux bending devices 218, flux splitting devices 228, flux concentrating and expanding devices 224 and 226, as well as flux switching devices 220 and 222. All of the switching and other flux bending apparatus in magnetic circuitry 223 may be controlled by digital control circuitry 230 formed on the same substrate 213.

It is important to note that, because the flux pipes of the present invention substantially confine the flux conducted therein and prevent it from interacting with flux conducted in other pipes, even at the points in the pipes where flux is bent or switched, very complex magnetic circuits can be created in a very small space. In this respect, the flux pipes act with respect to magnetic flux as do insulated conductors with respect to electric current.

Another advantage of micromagnetronic circuits in general is that the energy associate with their operation can be very low. For example, the energy contained in a flux pipe is given by $$\frac{B^2 V}{2\mu},$$

where B is the magnetic flux density, V is the volume of the flux pipe and μ is the magnetic permeability of the material inside the pipe. Because V is very small for pipes used in micromagnetronic circuits, very small amounts of energy are involved. It is also possible to place ferromagnetic materials having high permeability inside the pipe, further lowering the energy contained therein. Placement of ferromagnetic materials inside the micromagnetronic pipes has the further advantage of helping to confine the magnetic flux.

It is believed that superconductors may be used to implement micromagnetronic circuits, although normal conductors may also be used. When normal conductors are used, it is believed that silver would be preferable to copper in order to reduce Joule heating effects. It is also believed that additional benefits may be obtained with micromagnetronic circuits by using them in a pulsed mode of operation. Pulsed operation would reduce Joule heating even further, enabling a large number of components to be implemented in a small space. Moreover, micron-sized flux pipes will be relatively easy to switch from a no-power state to a full-power state and back again quickly because of the low energies involved and the resultant low inductances.

Figure 32A:
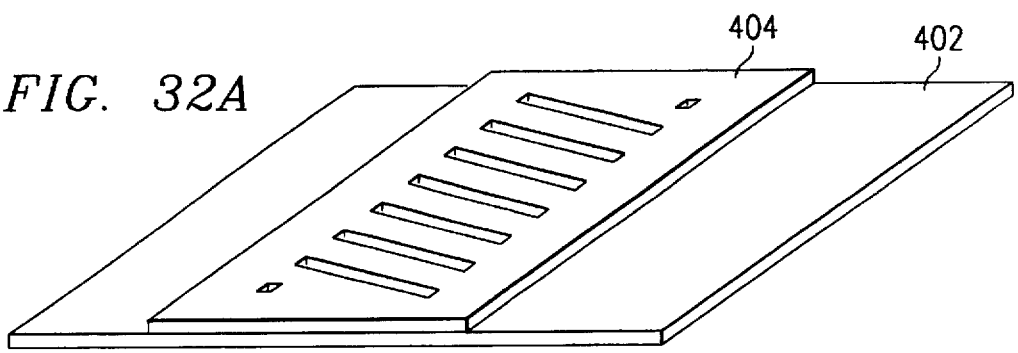
FIGS. 32A–D are perspective views illustrating the formation of a flux pipe on a microchip substrate.
Figure 32B:
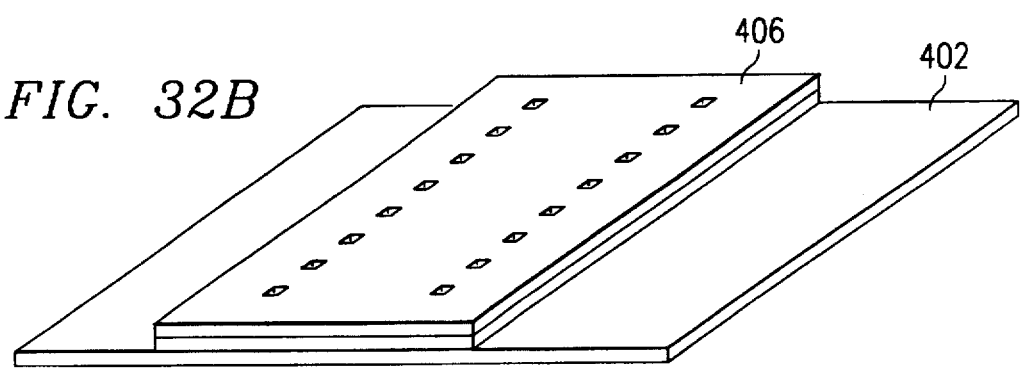
Figure 32C:
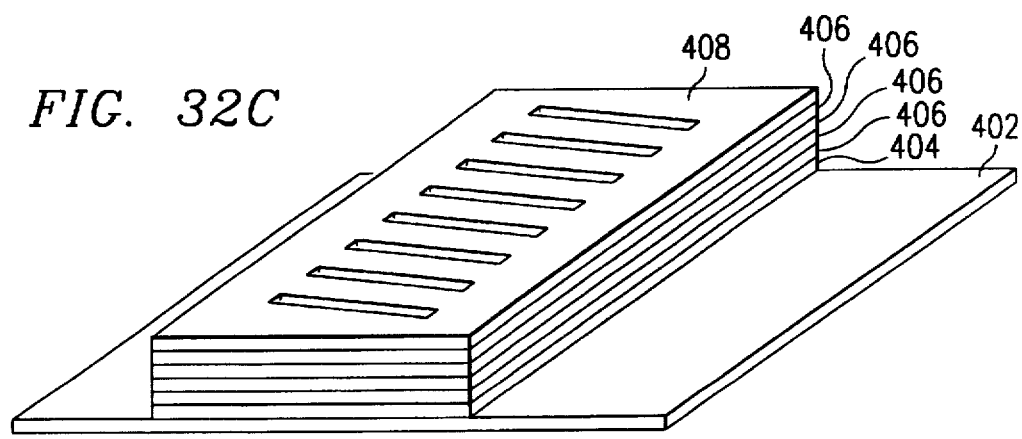
Figure 32D:
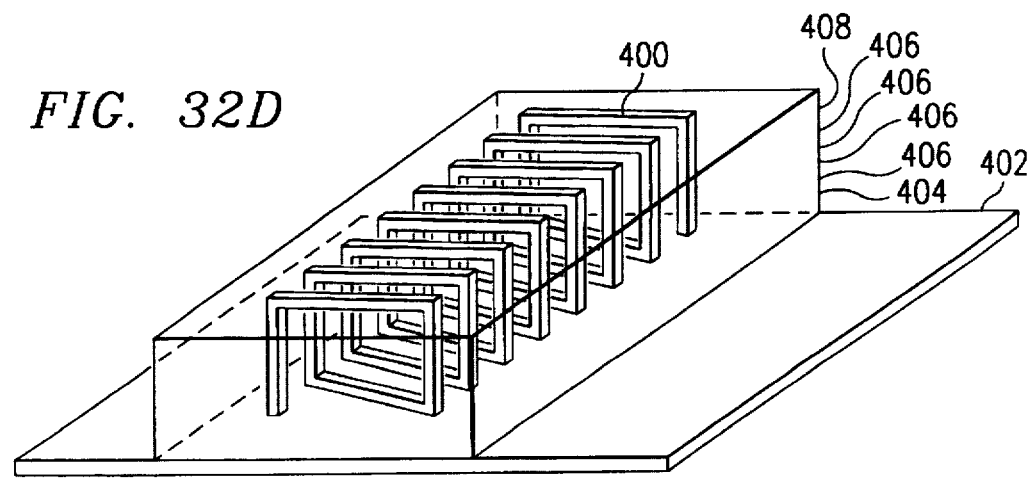

GENERAL CONSTRUCTION. FIGS. 32A–D illustrate generally how a flux pipe 400 having a size on the order of microns would be constructed on a micro-chip substrate 402 made of silicon or plastic or other suitable material. First, as shown in FIG. 32A, a layer of insulating material 404 such as silicon would be deposited on substrate 402 using an appropriate mask and conventional techniques such as vapor deposition in a high vacuum. Next, the interstices of insulating layer 404 would be filled, using another mask, with a conducting material such as high-purity copper or silver. Then, as shown in FIG. 32B, another insulating layer 406 would be deposited on top of layer 404. After layer 406 is deposited, its interstices would also be filled with the conducting material. Several identical layers 406 could be deposited on top of one another, and filled with conducting material in like fashion, to form the vertical portions of the turns of flux pipe coil 400. Finally, as shown in FIG. 32C, a different insulating layer 408 is deposited on the top layer 406 and its interstices are filled with the conducting material to complete flux pipe coil 400. The end result can be seen in FIG. 32D, a flux pipe on the order of microns, formed on a substrate and embedded in insulating material.

Figure 33A:
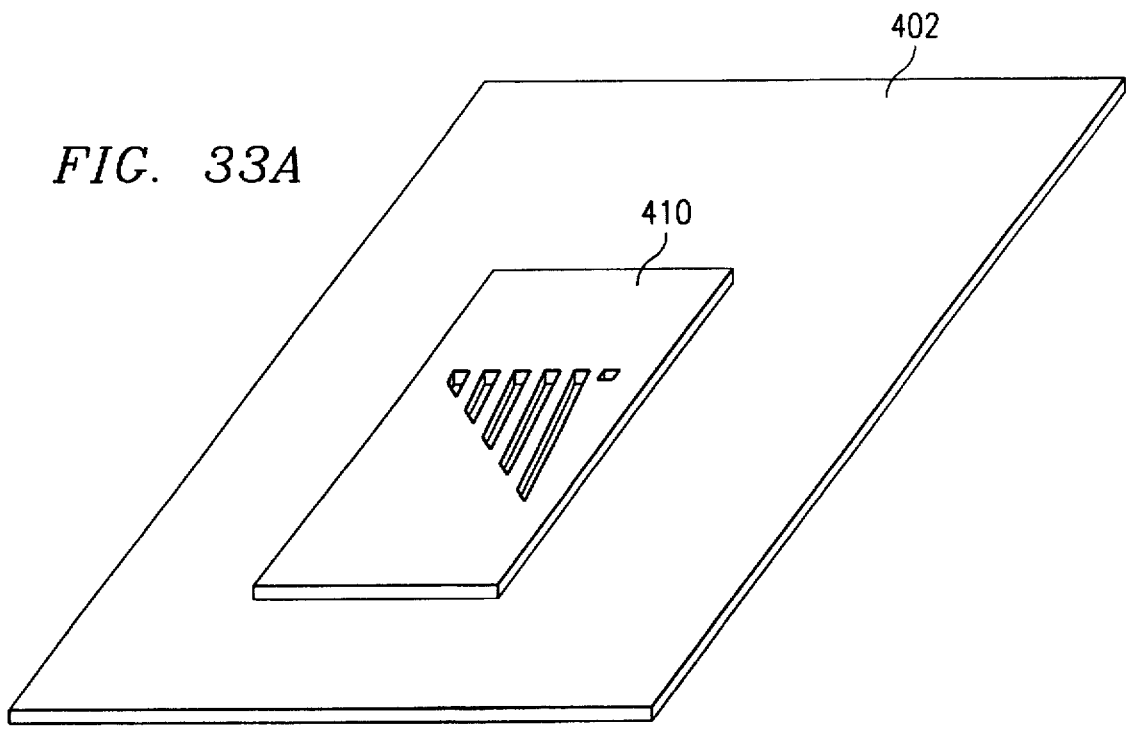
FIGS. 33A–D are perspective views illustrating the formation of half of a flux bending device on a microchip substrate.
Figure 33B:
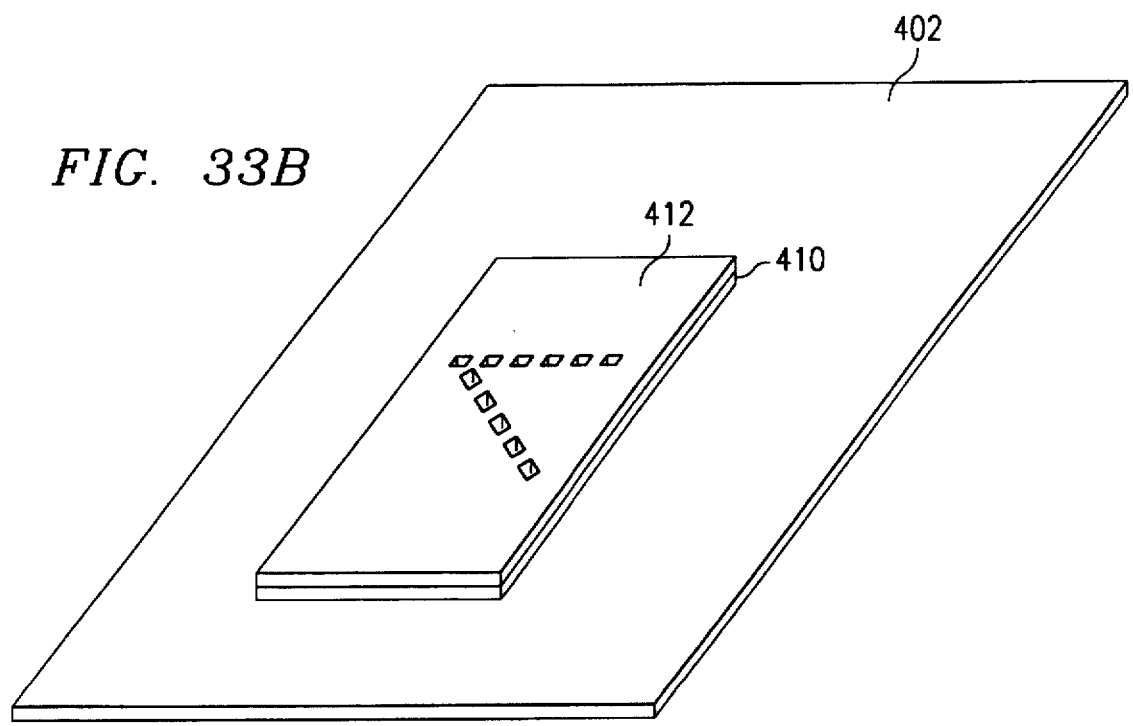
Figure 33C:
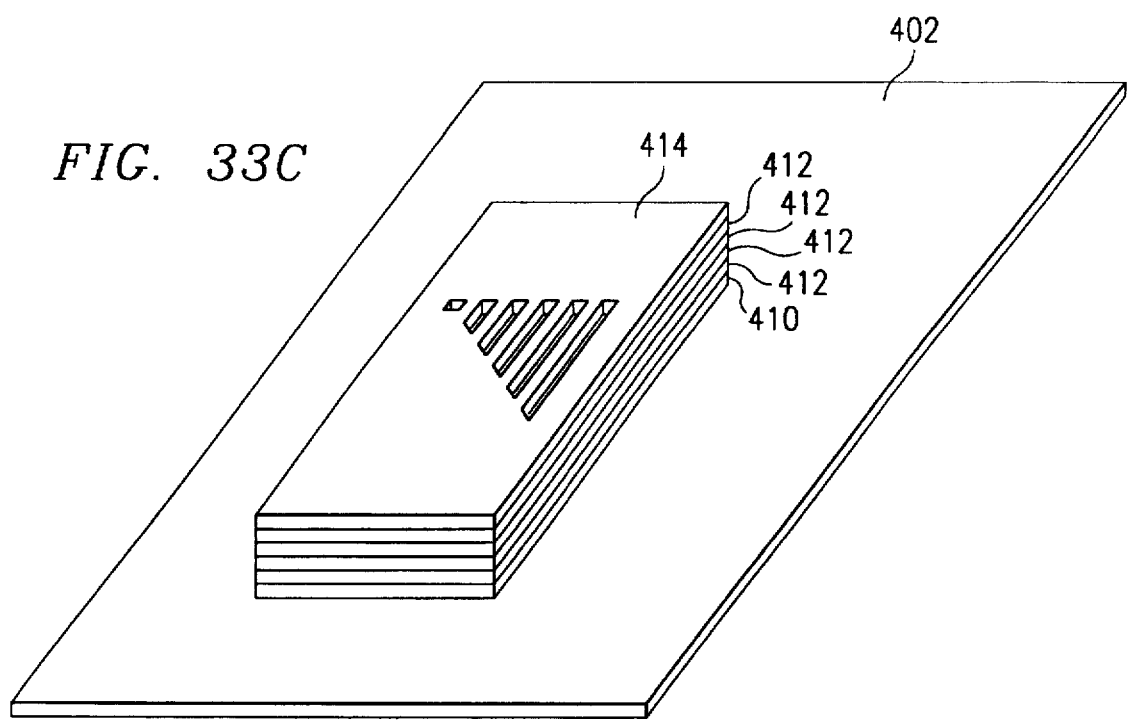
Figure 33D:
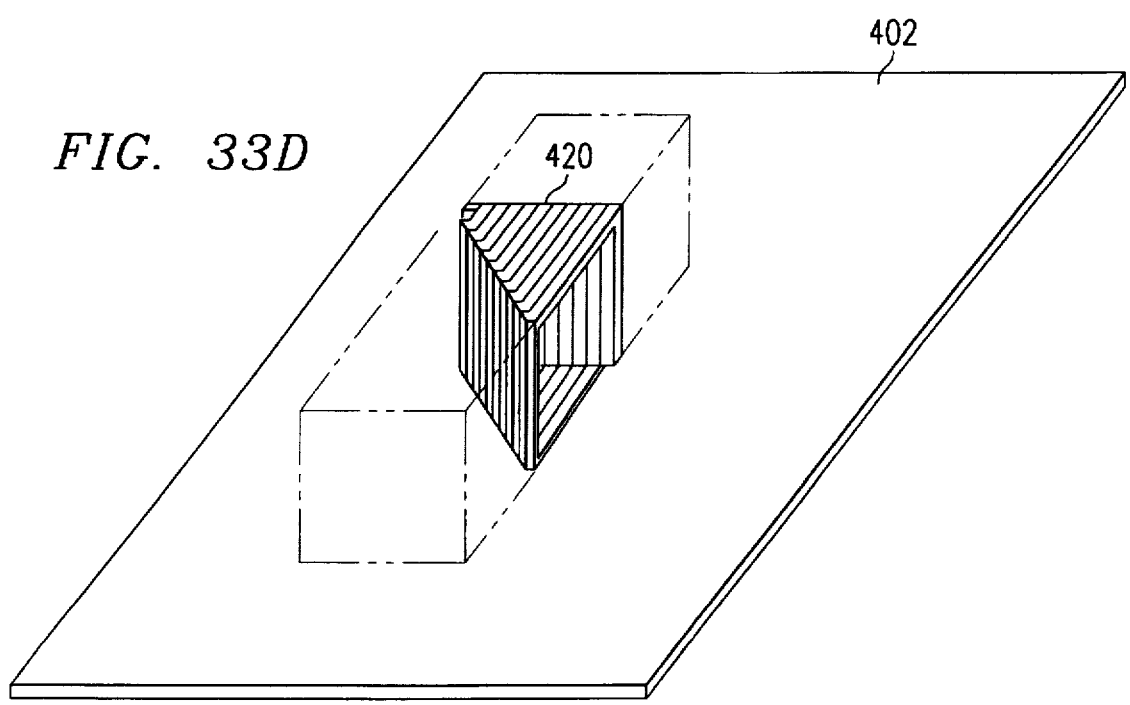

FIGS. 33A–D illustrate how the flux bending devices according to the invention would preferably be constructed in a substrate 402 such a micromagnetronic circuit. Coil 420 represents one half of a flux bending device analogous to those described hereinabove in reference, for example, to FIGS. 6 and 9. Although it is contemplated that both halves of the device would be constructed at the same time on the substrate, step-by-step from the bottom up, FIGS. 33A–D illustrate the construction of one-half only for clarity. In FIG. 33A, an insulating layer 410 is deposited on substrate 402 as described hereinabove using an appropriate mask and conventional techniques such as vapor deposition. Next, the interstices of layer 410 are filled with conducting material. Then, as shown in FIG. 33B, insulating layer 412 is deposited on top of layer 410 and filled with conducting material in like fashion. Several layers 412 are deposited and filled to form the vertical coil sections of device 420. Finally, as shown in FIG. 33C, a different insulating layer 414 is deposited on top of the topmost layer 412, and then filled with conducting material. The end result is shown in FIG. 33D, one half of a flux bending device having a size on the order of microns formed on a substrate 402 and embedded in insulating material.

Those having skill in the art will readily appreciate that different masks may be used to form more complex devices such as the modular components described hereinabove, including flux switches. Moreover, ferromagnetic materials may be deposited within the micron-sized flux pipes wherever necessary or desirable using an appropriate mask and deposition step.

Such techniques could be used to form hundreds of thousands of flux pipes on a single substrate simultaneously. By way of example, conductors used to form such micropipes could have cross sections on the order of a few tens or hundreds of square microns, and would be able to operate at a 100 gauss internal field when pulsed at a 1% duty cycle. In addition, several layers of flux pipes could be formed one on top of the other by repeating the deposition technique just described. Moreover, other components such as diodes and transistors could be interspersed among and connected to the flux pipes by the same vapor deposition technique to form the circuitry needed to control the flux pipes and flux bending and switching devices. Also, high-temperature superconducting materials could be vaporized directly onto the chip to create permanent and fast magnetic storage devices that do not use any ferromagnetic materials or ferrites.

A MICROMAGNETRONIC FIXED-MEDIUM DATA STORAGE DEVICE. To illustrate the utility of using the flux bending devices of the present invention in micromagnetronic circuits, FIGS. 34 through 39 will show a possible construction for a fixed-medium data storage device formed as an integrated circuit on a substrate. Such a data storage device would be designed around the basic building block of a one-bit memory cell 440, whose structure could be repeated hundreds of thousands of times on a single substrate.

Figure 36:
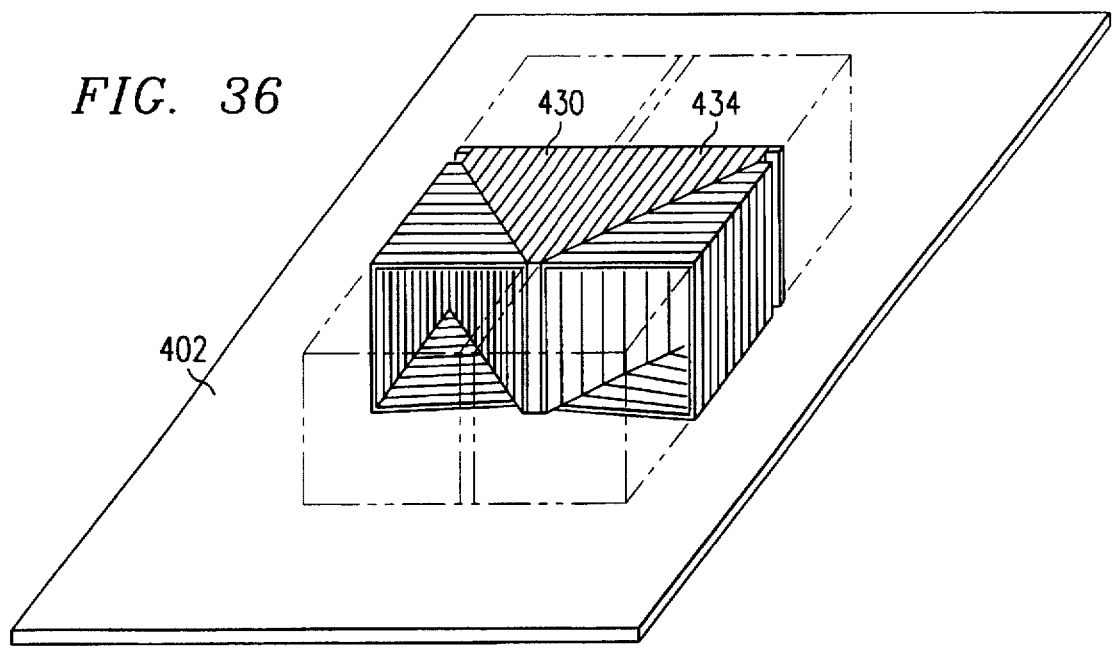
FIG. 36 is a perspective view illustrating two complete flux bending devices formed on a microchip substrate with a magnetic storage medium formed between them.
Figure 37A:
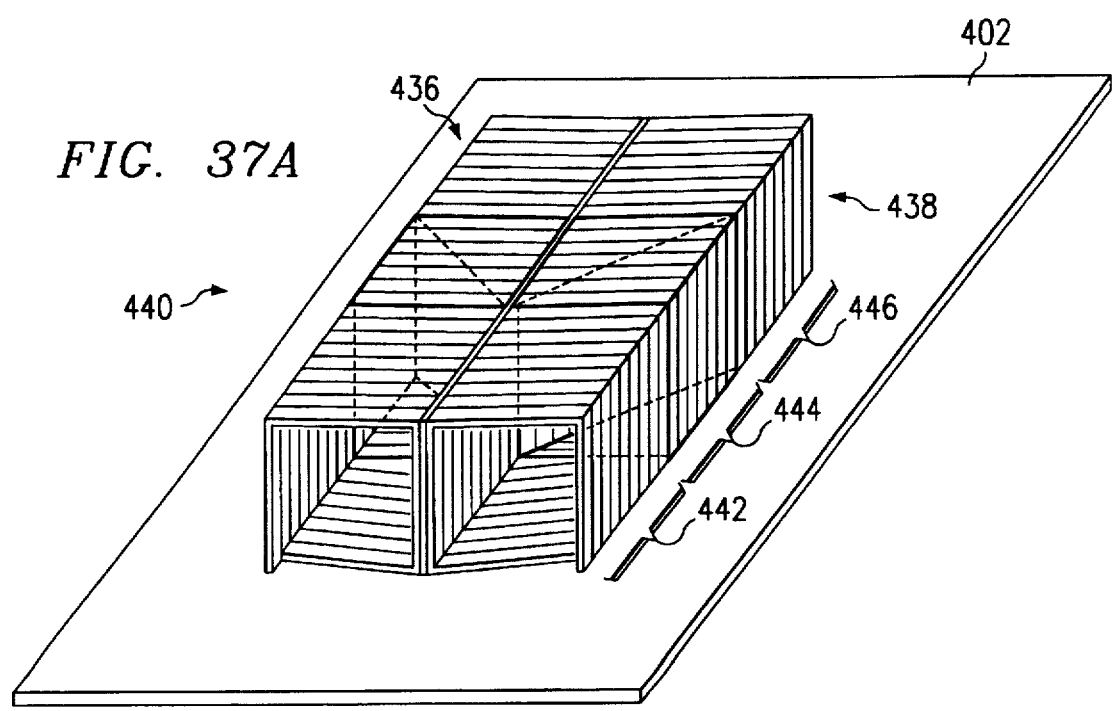
FIG. 37A is a perspective view illustrating a one-bit memory cell formed on a microchip substrate.
Figure 37B:
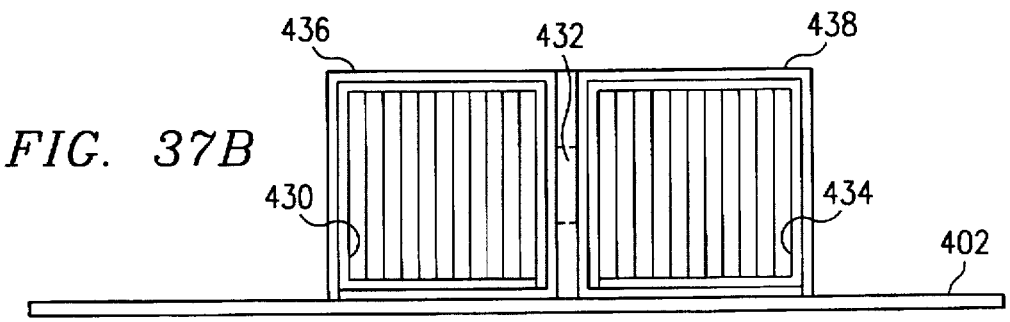
FIG. 37B is an end view of the one-bit memory cell of FIG. 37A.
Figure 38:
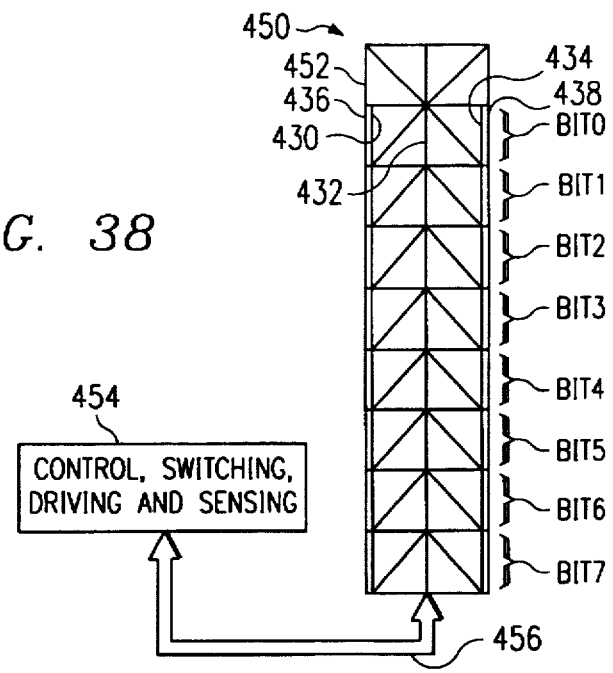
FIG. 38 is a schematic diagram illustrating an eight-bit memory cell formed on a microchip substrate.

A One-Bit Memory Cell. In short, to create a one-bit memory cell, the layer-by-layer masking, deposition and filing steps just described in relation to FIGS. 32 and 33 would be used to create the overall structure shown in FIGS. 37A and B. More specifically, FIGS. 34-36 show the components of such a memory cell. FIG. 34 shows a complete flux bending device 430 embedded in insulating material and formed on a substrate 402. FIG. 35 shows a magnetically alterable storage medium 432 having been deposited using the same techniques. FIG. 36 shows another flux bending device 434 formed on the same substrate 402 and symmetrically opposing flux bending device 430, with storage medium 432 disposed in between the two flux bending devices. FIG. 37A shows, in a perspective view, longitudinal flux pipes 436 and 438 having been formed around flux bending devices 430 and 434, respectively. It will be understood that, although the components are shown being separately constructed in these figures for clarity, in actual construction all of the various and just-described components of memory cell 440 would preferably be constructed at once in step-by-step fashion from the substrate upwards using appropriate masks. FIG. 37B shows the completed structure from the end view looking into flux pipes 436 and 438 from the direction indicated in FIG. 37A.

Note that flux pipes 436 and 438 should be constructed and electrically configured such that coil sections 442, 444 and 446 may be energized independently. In other words, each such coil section should be a separate series circuit. In addition, flux bending devices 430 and 434 should be constructed and electrically configured such that they may be energized independently of the coil sections in flux pipes 436 and 438. In this manner, the various components of memory cell 440 may be independently coupled to suitable control, switching and driving circuitry so that memory cell 440 will operate as a flux switch. Specifically, if each of coil sections 442, 444 and 446 are energized in flux pipes 436 and 438 while flux bending devices 430 and 434 are not energized, then the flux bending devices will be transparent to the flux, and the flux will not pass through storage medium 432. On the other hand, if flux bending devices 430 and 434 are energized, coil sections 442 are energized, and coil sections 444 and 446 are not energized, then the path of the flux will be switched and will pass through storage medium 432, enabling memory cell 440 to be written or read.

An Eight-Bit Memory Cell. The one-bit memory cell 440 may be repeated on substrate 402 to form an eight-bit memory cell 450, as shown schematically in FIG. 38 (top view). As can be seen, the basic structure of memory cell 440 is repeated eight times in one longitudinal direction to form bits 0 to 7. Flux pipes 436 and 438 extend along the outside of the entire structure. At the end of cell 450, a flux return 452 is formed so as to provide a complete magnetic circuit when reading or writing any of bits 0 to 7.

Driving and switching circuity 454 used to control the components of cell 450 can be formed using conventional techniques, can be formed on the same substrate 402 as memory cell 450, and can be coupled to cell 450 with control wires 456. Data is written to a selected bit (1) selecting flux return 452, the appropriate sections of flux pipes 436 and 438, and the flux bending device pair associated with the desired bit, and (2) pulsing each of the selected components with current in order to pass sufficient magnetic flux through the bit's storage medium to set its state to the desired polarity. In order to read the bit, the appropriate components are again selected and sensing the impedance of the resulting circuit by conventional techniques. Specifically, the circuit is pulsed with low current first in one direction and then in the opposite direction, and the impedance of the circuit in both cases is measured and compared to determine the polarity of the bit.

Figure 39A:
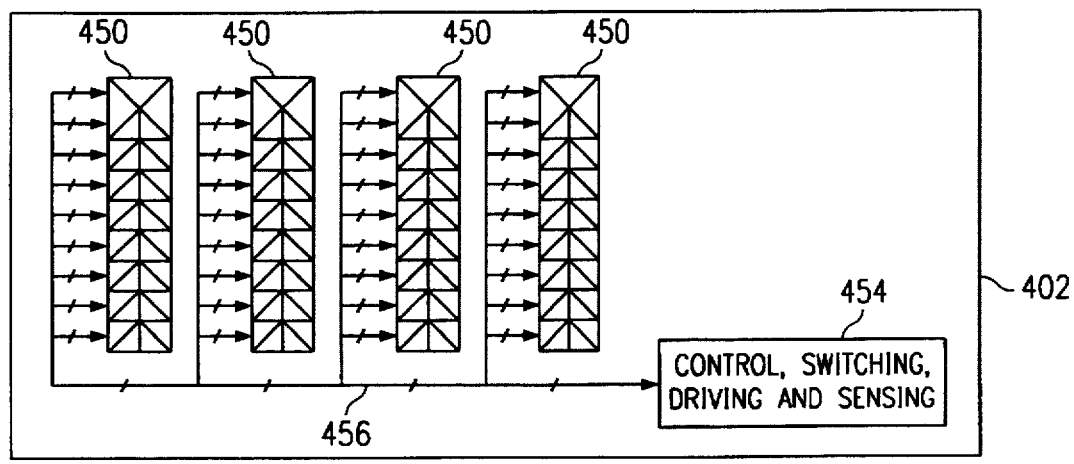
FIG. 39A is a schematic diagram illustrating a 4×4×8-bit memory cell formed on a microchip substrate.
Figure 39B:
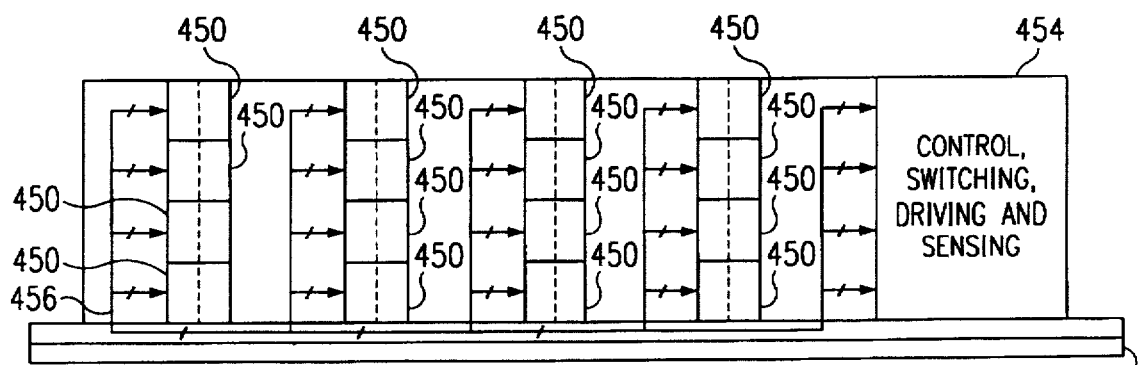
FIG. 39B is a side view of the memory cell of FIG. 39A.

N-Bit Data Storage Devices. The structure of memory cell 450 may be repeated hundreds of thousands of times on a single substrate 402. In order to illustrate the scalability of this concept, FIGS. 39A (top view) and 39B (side view) show a 4×4×8 bit memory cell. Although larger, control circuitry 454 and lines 456 serve the same purpose as in FIG. 38. FIGS. 39A and B illustrate that the basic memory cell structure may be repeated not only in two dimensions along the plane of the substrate 402, but also in three dimensions, vertically upward from the substrate 402.

Advantages of Micromagnetronic Fixed-Medium Data Storage Devices. The advantages of using such a configuration for data storage are numerous. First, flux pipes such as those just described can be made extremely small, and thus may be integrated onto a microchip to achieve high-density magnetic recording. Second, traditional magnetic recording requires media such as a disk that holds a very large number of very small ferromagnetic particles. A recording head separated from the media by a gap can read or write on the media by selectively magnetizing the particles or detecting their state of magnetization. The gap is needed because the head and media move relative to each other for scanning purposes. By contrast, in a micromagnetronic data storage device according to the invention, there is no head and no motion. Instead, magnetic flux is directed to or from each particle by the flux pipes. All information stored in the particles is immediately available via electronic signals because no motion is involved. Therefore, a micromagnetronic data storage device according to the invention can be much faster than a conventional magnetic recording device. Moreover, the presence of a gap between a standard recording head and the media places a severe restriction on the smallness of the ferromagnetic particles that may be used therewith. No such restriction applies for data storage devices according to the invention, where much smaller particles can be used and a much higher recording density can be achieved.

While the invention has been described in detail with reference to specific embodiments thereof, modifications and adaptations of the invention will be suggested to those having skill in the art and having reference to this specification and accompanying drawings. It is to be understood that the invention is not limited to the particular forms disclosed, but rather encompasses all modifications, equivalents and alternatives falling within the spirit and scope of the invention as defined by the following claims.

I claim:

1. An apparatus for bending magnetic flux from a first to a second path, comprising:

first and second means for substantially confining magnetic flux along the first and second paths respectively, said first means having a first end and said second means having a second end; and means for conducting a substantially planar electric current, said means for conducting a substantially planar electric current disposed at least partially between said first and second ends and oriented so that the magnetic field within said first means nearest said first end has a non-zero component normal to the plane of the substantially planar electric current and wherein said means for conducting a substantially planar electric current comprises a plurality of substantially parallel linear conductors and further wherein at least one of said first and second means for substantially confining magnetic flux comprises a conducting coil having a plurality of turns, at least one of said turns including a linear portion, and wherein said linear portion comprises one of said plural substantially parallel linear conductors.

2. The flux bending apparatus of claim 1, wherein said plurality of turns and said plurality of substantially parallel linear conductors comprise one series electric circuit.

3. The flux bending apparatus of claim 1, wherein at least some of said substantially parallel linear conductors are arranged on a form having a substantially stair-stepped pattern.

4. The flux bending apparatus of claim 1, wherein at least some of said substantially parallel linear conductors are arranged on a form having a flat surface with a plurality of winding supports attached thereto at intervals.

5. The flux bending apparatus of claim 4, wherein said winding supports are on both sides of said flat surface and are orthogonal to said flat surface.

6. An apparatus for bending magnetic flux from a first to a second path, comprising:

first and second means for substantially confining magnetic flux along the first and second paths respectively, said first means having a first end and said second means having a second end, wherein said first and second means for substantially confining magnetic flux comprise first and second conducting coils respectively, said first and second conducting coils comprising first and second pluralities of turns respectively, at least some of said plural turns having a linear portion; and means for conducting a substantially planar electric current, said means for conducting a substantially planar electric current disposed at least partially between said first and second ends and oriented so that the magnetic field within said first means nearest said first end has a non-zero component normal to the plane of the substantially planar electric current and wherein said means for conducting a substantially planar electric current comprises a plurality of substantially parallel linear conductors and further, wherein the linear portions of said at least some plural turns comprise said plurality of substantially parallel linear conductors; and wherein said first and second conducting coils and said plurality of substantially parallel linear conductors comprise one series electric circuit.

7. An apparatus for dividing and directing magnetic flux from one path into two or more paths, comprising:

first, second and third means for substantially confining magnetic flux along first, second and third paths respectively, said first means having a first end, said second means having a second end and said third means having a third end; and first and second means for conducting first and second substantially planar electric currents respectively;

said first means for conducting said first substantially planar electric current disposed at least partially between said first and second ends and oriented so that at least part of the magnetic field within said first confining means nearest said first end has a non-zero component normal to the plane of said first substantially planar electric current; and said second means for conducting said second substantially planar electric current disposed at least partially between said first and third ends and oriented so that at least part of the magnetic field within said first confining means nearest said first end has a non-zero component normal to the plane of said second substantially planar electric current.

8. The apparatus of claim 7, wherein at least one of said first, second and third means for substantially confining magnetic flux comprises a conducting coil having a plurality of turns.

9. The apparatus of claim 7, wherein said first, second and third means have axes, and wherein the axes of said second and third means are oriented at approximately ninety degrees from the axis of said first means, thus forming a T-shaped connection with said first means, and wherein the respective planes of said first and second substantially planar electric currents are different.

10. The apparatus of claim 7, wherein at least one of said first and second conducting means comprises a plurality of substantially parallel linear conductors.

11. The apparatus of claim 10, wherein at least one of said first, second and third means for substantially confining magnetic flux comprises a conducting coil having a plurality of turns, at least one of said turns including a linear portion, and wherein said linear portion comprises one of said plural substantially parallel linear conductors.

* * * * *

UNITED STATES PATENT AND TRADEMARK OFFICE
CERTIFICATE OF CORRECTION

PATENT NO. : 5,798,679
DATED : August 25, 1998
INVENTOR(S) : Sergio Pissanetzky

It is certified that error appears in the above-identified patent and that said Letters Patent is hereby corrected as shown below:

Col. 9, line 54: delete "and (16) for H' and"; insert -- and (16) for $\beta$ and --.

Signed and Sealed this

First Day of December, 1998

*Attest:*

BRUCE LEHMAN

*Attesting Officer*     *Commissioner of Patents and Trademarks*